(12) United States Patent
Russ et al.

(10) Patent No.: US 7,274,047 B2
(45) Date of Patent: Sep. 25, 2007

(54) SILICON CONTROLLED RECTIFIER ELECTROSTATIC DISCHARGE PROTECTION DEVICE FOR POWER SUPPLY LINES WITH POWERDOWN MODE OF OPERATION

(75) Inventors: Cornelius Christian Russ, Diedorf (DE); Markus Paul Josef Mergens, Ravensburg (DE); John Armer, Middlesex, NJ (US); Koen Gerard Maria Verhaege, Gistel (BE)

(73) Assignees: Sarnoff Corporation, Princeton, NJ (US); Sarnoff Europe BVBA, Gistel (BE)

( * ) Notice: Subject to any disclaimer, the term of this patent is extended or adjusted under 35 U.S.C. 154(b) by 0 days.

(21) Appl. No.: 11/032,462

(22) Filed: Jan. 10, 2005

(65) Prior Publication Data

US 2005/0145947 A1 Jul. 7, 2005

Related U.S. Application Data

(63) Continuation of application No. 10/648,545, filed on Aug. 25, 2003, now Pat. No. 6,850,397, and a continuation-in-part of application No. 10/007,833, filed on Nov. 5, 2001, now Pat. No. 6,791,122.

(60) Provisional application No. 60/461,676, filed on Apr. 10, 2003, provisional application No. 60/280,345, filed on Mar. 30, 2001, provisional application No. 60/266,171, filed on Feb. 2, 2001, provisional application No. 60/246,123, filed on Nov. 6, 2000.

(51) Int. Cl.
*H01L 29/749* (2006.01)

(52) U.S. Cl. .............. 257/133; 257/173; 257/355; 257/358; 257/359; 257/360; 257/E29.215; 257/E29.216; 257/E29.217; 257/E29.218; 438/135

(58) Field of Classification Search ............... 257/355, 257/356, 357, 123–124, 107, 133, 173, 174, 257/162, 141, 122
See application file for complete search history.

(56) References Cited

U.S. PATENT DOCUMENTS 5,204,541 A * 4/1993 Smayling et al. ........... 257/138
5,262,344 A 11/1993 Mistry (Continued)

*Primary Examiner*—Jerome Jackson
*Assistant Examiner*—Paul Budd
(74) *Attorney, Agent, or Firm*—Lowenstein Sandler PC

(57) ABSTRACT

An electrostatic discharge (ESD) protection circuit in a semiconductor integrated circuit (IC) having protected circuitry. The ESD protection circuit includes a silicon controlled rectifier (SCR) having at least one first type high dopant region coupled to a first reference potential of the protected circuitry, and at least one second type high dopant region coupled to a second reference potential of the IC. The SCR is triggered by an external on-chip trigger device, which is adapted for injecting a trigger current into at least one gate of the SCR.

9 Claims, 15 Drawing Sheets

U.S. PATENT DOCUMENTS

| | | | |
|---|---|---|---|
| 5,276,582 A | 1/1994 | Merrill et al. | |
| 5,289,334 A | 2/1994 | Ker et al. | |
| 5,311,391 A | 5/1994 | Dungan et al. | |
| 5,404,041 A | 4/1995 | Diaz et al. | |
| 5,498,892 A | 3/1996 | Walker et al. | |
| 5,591,992 A * | 1/1997 | Leach | 257/173 |
| 5,594,611 A | 1/1997 | Consiglio et al. | |
| 5,602,404 A | 2/1997 | Chen et al. | |
| 5,615,073 A | 3/1997 | Fried et al. | |
| 5,640,299 A | 6/1997 | Leach | |
| 5,675,469 A | 10/1997 | Racino et al. | |
| 5,742,084 A * | 4/1998 | Yu | 257/356 |
| 5,754,380 A | 5/1998 | Ker et al. | |
| 5,856,214 A | 1/1999 | Yu | |
| 5,870,268 A | 2/1999 | Peng et al. | |
| 6,004,838 A | 12/1999 | Ma et al. | |
| 6,034,388 A | 3/2000 | Brown et al. | |
| 6,061,218 A * | 5/2000 | Ida et al. | 361/56 |
| 6,130,117 A | 10/2000 | Walker et al. | |
| 6,172,404 B1 | 1/2001 | Chen et al. | |
| 6,825,504 B2 * | 11/2004 | Ishizuka et al. | 257/173 |
| 2002/0020880 A1 * | 2/2002 | Yu | 257/360 |
| 2002/0021538 A1 * | 2/2002 | Chen et al. | 361/56 |
| 2004/0100745 A1 | 5/2004 | Chen et al. | |

* cited by examiner (E)

1200

US 7,274,047 B2

SILICON CONTROLLED RECTIFIER ELECTROSTATIC DISCHARGE PROTECTION DEVICE FOR POWER SUPPLY LINES WITH POWERDOWN MODE OF OPERATION

CROSS REFERENCES

This patent application claims the benefit of U.S. patent application Ser. No. 10/648,545, filed on Aug. 25, 2003, which claims the benefit of U.S. Provisional Application, Ser. No. 60/461,676, filed on Apr. 10, 2003, and U.S. patent application Ser. No. 10/007,833, filed on Nov. 5, 2001 (now U.S. Pat. No. 6,791,122), which also claims the benefit of U.S. Provisional Applications Ser. Nos. 60/280,345, filed Mar. 30, 2001; 60/246,123, filed Nov. 6, 2000; and 60/266,171, filed Feb. 2, 2001. This patent application is also related to commonly assigned and co-pending U.S. patent applications Ser. No. 10/783,844, filed Feb. 20, 2004, and Ser. No. 10/899,383, filed Jul. 26, 2004, as well as U.S. Pat. Nos. 6,768, 616 and 6,803,633. The aforementioned patent applications and patents are all incorporated by reference herein in their entireties.

FIELD OF THE INVENTION

This invention generally relates to the field of electrostatic discharge (ESD) protection circuitry, and more specifically, to ESD silicon controlled rectifier (SCR) devices for use between power-to-power supply lines on an IC, wherein the power supply lines are allowed to go into a power-down mode of operation.

BACKGROUND OF THE INVENTION

Integrated circuits (IC's) and other semiconductor devices are extremely sensitive to high voltages that may be generated by contact with an ESD event. As such, electrostatic discharge (ESD) protection circuitry is essential for integrated circuits. An ESD event commonly results from the discharge of a high voltage potential (typically, several kilovolts) and leads to pulses of high current (several amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC's and thus require expensive repairs on the products, which could have been avoided by providing a mechanism for dissipation of the electrostatic discharge to which the IC may have been subjected.

The ESD problem has been especially pronounced in complementary metal oxide semiconductor (CMOS) field effect transistors. To protect against these over-voltage conditions, silicon controlled rectifiers (SCR) and other protection devices such as the grounded-gate NMOS have been incorporated within the circuitry of the CMOS IC to provide a discharge path for the high current produced by the discharge of the high electrostatic potential. Prior to an ESD event, the SCR is in a nonconductive state. Once the high voltage of an ESD event is encountered, the SCR then changes to a conductive state to shunt the current to ground. The SCR maintains this conductive state until the voltage is discharged to a safe level.

FIG. 1A depicts a schematic diagram of a prior art SCR included within an integrated circuit to provide ESD protection as illustratively provided in U.S. Pat. Nos. 5,465,189 and U.S. Pat. No. 5,502,317. In particular, an illustrative prior art integrated circuit 100 has an SCR protection circuit 101 connected from a pad 148 to ground. The pad 148 is also connected to the protected circuitry of the IC, optionally through a current limiting resistor $R_L$. The SCR protection circuit 101 comprises a trigger device 105 and an SCR 102. The SCR 102 further comprises a NPN transistor T1 131 and a PNP transistor T2 132. In particular, the SCR protection device 101 includes an anode 122, which is connected to the pad 148, and to one side of a resistor $R_{B2}$ 142. The resistor $R_{B2}$ 142 represents the resistance of the N-Well, which is seen at the base of a PNP transistor of the SCR 102, as is discussed in further detail below. Additionally, the anode 122 is coupled to an emitter 108 of a PNP transistor T2 132, which is parallel to the N-Well resistance $R_{B2}$ 142. A first node 134 includes the base of the PNP transistor T2 132, the other side of the resistor $R_{B2}$ 142, and the collector of the NPN transistor T1 131. Additionally, the collector 106 of the PNP transistor T2 132 is connected to a second node 136, which is also connected to the base 106 of the NPN transistor T1 131, and to one side of a resistor $R_{B1}$ 141. The other side of resistor $R_{B1}$ 141 is connected to a third node 124 that is grounded, and which serves as the cathode. Furthermore, the emitter 112 of the NPN transistor T1 131 is also connected to the grounded third node 124.

The triggering device 105 is illustratively a grounded gate NMOS (GGNMOS) transistor, which has its source 127 and gate 126 coupled to ground. Additionally, the drain 129 and source 127 of the GGNMOS transistor 105 are respectively coupled to the collector 110 and the emitter 112 of the NPN transistor T1 131. Furthermore, the gate 126 and source 127 of the GGNMOS transistor are also connected to the grounded third node 124 (i.e., cathode of the SCR).

FIG. 1B depicts a cross-sectional view of a prior art low voltage triggering SCR (LVTSCR) device as depicted in FIG. 1A. Furthermore, FIG. 1B illustratively includes the schematic diagram of the SCR circuit as related to the P and N doped regions of the IC 100. Specifically, the integrated circuit 100 includes a P-type substrate 103 into which an N-Well 104 and P-well 106 are formed adjacent to each other. A junction 107 is formed at the adjoining boundary of the N-Well 104 and the P-well 106.

Within the N-Well 104, a first P+ region 108 is formed. Furthermore, within the P-well 106, a first N+ region 112 and a second P+ region 114 are formed thereupon. In addition, a second N+ region 110 is formed over both the P-well 106 and N-Well 104 regions such that the second N+ region 110 overlaps the junction 107 of the P-well and N-Well regions 106 and 104. The regions denoted P+ an N+ are regions having higher doping levels than the N-Well and P-well regions 104 and 106.

Shallow trench isolation (STI) is used in most state-of-the-art CMOS processing technologies to laterally separate the high-doped regions. Shallow trench isolation is performed prior to forming the high P+ and N+ doped regions. In particular, trenches are etched in specific areas from the silicon surface, and an insulator material (e.g., silicon dioxide ($SiO_2$)) is deposited to fill the trenches. A gate dielectric layer such as silicon dioxide ($SiO_2$) 130 is grown over the parts of the surface exposing bare silicon. A gate electrode material (e.g. poly silicon) is deposited over the entire surface. The gate electrode material and the gate dielectric are structured by a photo-lithographical masking followed by an etching step. After the masking and etching steps, only the photo patterned area of the gate dielectric 130 and the gate electrode 128 remain, as illustrated. Then, the silicon between the STI receives ion implants to form the high-doped P and N regions as discussed above.

Specifically, after performing the STI and creating the high-doped regions, a first STI region $116_1$ is positioned illustratively to the left of the first P+ doped region 108. Additionally, a second STI region $116_2$ is positioned between the first P+ region 108 and the second N+ region 110. Furthermore, a third STI region $116_3$ is positioned between the first N+ region 112 and the second P+ region 114, and a fourth STI region $116_4$ is positioned to the left of the second P+ region 114.

The gate 126 of the GGNMOS transistor 105 separates the first and second N+ regions 112 and 110. Furthermore, the GGNMOS transistor 105 is used to "trigger", i.e., turn on the SCR. In particular, the GGNMOS transistor 105 is an N-channel MOS transistor, which includes a drain 129 and source 127, which are respectively formed by the second N+ region 110 and the first N+ region 112. The NMOS-channel is formed at the surface of the P-well region 120 between the first and second N+ regions 112 and 110. Additionally, since the gate 126 is grounded, the P-well region 120 is prevented from forming the NMOS-channel between the first and second N+ regions 112 and 110, thereby preserving the functionality of the SCR's bipolar transistor T1 131.

The NPN transistor T1 131 has its emitter formed by the first N+ region 112, the base formed by the P-well 106, and the collector formed by the N-Well 104, which is electrically in parallel with the second N+ region 110 (NMOS drain 129). The PNP transistor T2 132 has its emitter formed by the first P+ region 108, the base formed by the N-Well 104 and the second N+ region 110, and the collector formed by the P-well 106. It should be noted that the N-Well 104 and the drain region 110 define both the collector of the NPN transistor T1 131 and the base of the PNP transistor T2 132.

The first P+ region 108 is spaced apart from the second N+ region 110. In an instance where the N-Well 104 is optionally connected by an additional N+ region (not shown) to the anode 122, then the N-Well resistance $R_{B2}$ 142 is defined therebetween (For example, an additional N+ region in the N-Well 104). Otherwise, if the N-Well is floating the resistor $R_{B2}$ 142 is not defined (as drawn in phantom in FIG. 1B). As such, the well resistance $R_{B2}$ 142 is the base resistance of the PNP transistor T2 132, and has a resistance value that depends on the N-type material resistivity value. The N-type material includes the level of doping, as well as the length and cross-sectional area of the N-Well 104 (i.e., base). Typically, the resistance $R_{B2}$ 142 is in the range of 500 Ohm to 5000 Ohms, or it is an open if the N-Well is floating (as shown in FIG. 1B). Furthermore, since the second N+ region 110 is coupled to the N-Well 104, the N+ region 110 also functions as part of the base of the PNP transistor T2 132. Likewise, the P-well region 106 forms the base of the NPN transistor T1 131 and also has a substrate resistance $R_{B1}$ 141. Typically, the resistance $R_{B1}$ 141 is in the range of 500 to 5000 Ohms.

The anode 122, cathode 124, and a substrate-tie 125 are respectively coupled to the first P+ region 108, the first N+ region 112, and the second P+ region 114 through silicide layers $118_A$, $118_C$, and $118_S$ (collectively silicide layers 118). Furthermore, one skilled in the art will recognize that there are older process technologies that do not have the silicide layer. As such, the anode 122, cathode 124, and substrate-tie 125 are directly connected to the N+ and P+ regions. The silicide layers 118 are formed such that a conductive metal (typically tungsten or cobalt) is deposited as a very shallow film over the entire IC wafer. A heating step follows and the metal reacts only with the silicon surface to form an alloy of silicon and metal ("silicide"). The other surfaces such as oxides or nitrides do not react with the metal. The non-reacted metal is selectively etched away so that only the silicide layers remain on the silicon. The silicide layers 118 serve as a conductive bonding material respectively between each metal contact $121_A$, $121_C$, and $12_S$ (collectively metal contacts 121) of the anode 122, cathode 124, and substrate-tie 125. FIG. 1B depicts a typical implementation where silicide formation is blocked in part of the NMOS 105.

In operation, the protective SCR circuit 102, which comprises the NPN and PNP transistors T1 131 and T2 132, will not conduct current between the anode 122 and the grounded cathode 124. That is, the SCR 102 is turned off, since there is no high voltage (e.g., ESD voltage) applied to the SCR 102, but only the regular signal voltage of the IC. Once an ESD event occurs at the pad 148, a voltage potential appears on the anode 122. Furthermore, the voltage potential created by the ESD event is transferred in part to the N+ region 110 via the N-Well 104. That is, the anode 122, P+ region 108, N-Well region 104, and N+ region 110 are connected in series such that a voltage will form at the N+ region 110.

The N+ region 110 and the P-well 106 form a diode that functions as a triggering mechanism for the SCR 102. In particular, the N+ region 110 and the P-well region 120 act as a diode $D_R$. The diode $D_R$ (drawn in phantom) will conduct when the voltage across the diode exceeds the diode reverse breakdown voltage, typically 6-10 volts. That is, once the voltage transferred in part from the ESD event on the N+ region 110 exceeds the diode $D_R$ reverse breakdown voltage, an avalanche effect occurs such that holes and electrons are generated in the PN-junction of the diode $D_R$. The holes flow into the P-well regions 120 and 119 of the P-well 106 and to the grounded P+ region 114. The potential in the P-well regions 120 and 119 increases and electrons flow from the N+ region 112 (emitter) mainly into the P-well region 120 and also into the part of the P-well region denoted 119. The flow of minority carriers (electrons) into the P-well region 120 causes the SCR 102 to trigger. Likewise, the electrons generated in the PN-junction of the diode $D_R$ will flow into the N-Well 104 and cause the P+ emitter 108 to inject minority carriers (holes) into the N-Well 104.

Specifically, the majority carriers (i.e., holes) generated at the PN-junction of the N+ region 110 and the P-well region 120 recombine in the P-well regions 120 and 119 with the minority carriers (electrons) injected from the N+ region 112 (emitter). As such, the base of the NPN transistor T1 131 draws current, illustratively at the gate G1 in the P-well region 120, which subsequently turns on the NPN transistor T1 131. Furthermore, the collector of the NPN transistor T1 131 is coupled to the base of the PNP transistor T2 132, which turns on the PNP transistor T2 132. The collector current of the NPN transistor T1 131 equals the current gain of T1 131 ($\beta_1$) times the base current of the transistor T1 131. The current gain $\beta_1$ is dependent on the geometrical dimensions and the doping levels in the base and emitter of the NPN transistor T1 131. Likewise, a current gain $\beta_2$ is dependent on the geometrical dimensions and the doping level of the PNP transistor T2 132.

As such, once the NPN transistor T1 131 is turned on, the T1 131 collector provides the base current to the PNP transistor T2 132. Therefore, the base current of the PNP transistor T2 132 is greater than the base current of the NPN transistor T1 131. Moreover, the current gain $\beta_2$ of the PNP transistor T2 132 is realized as the T2 132 collector current, which is then fed back to the base of the NPN transistor T1 131, thereby amplifying the base current of the NPN transistor T1 131. This amplification of the base currents in the SCR 102 progressively continues to increase in a loop between both transistors T1 131 and T2 132. Therefore, the conduction occurring in a turned on SCR is also called a "regenerative process".

The SCR 102 becomes highly conductive and sustains the current flow with a very small voltage drop between the anode and cathode (typically, 1-2V). Accordingly, once the SCR 102 is turned on, the current from the ESD event passes from anode 122 to the grounded cathode 124. As such, the SCR 102 protects the remaining portion of the IC circuitry 100. Once the ESD event has been discharged from the anode 122 to the cathode 124, the SCR 102 turns off because it cannot sustain its regenerative conduction mode.

It is critical to discharge the ESD event as quickly as possible to prevent damage to the circuitry of the IC, as well as to the protective SCR itself. In the above prior art LVTSCR, the NMOS transistor 105 is integrated within the SCR 102. The N+ region diffusion 110, which is inserted as an integrated trigger means, is disadvantageous due to the excessive base widths of the NPN transistor T1 131 and the PNP transistor T2 132. Therefore, the large lateral T1 and T2 transistor dimensions, due to the insertion of the N+ diffusion and the high recombination of charge carriers, results in slow SCR triggering. In particular, the N+ region 110 ("trigger diffusion region"), which is also part of the base of the PNP transistor T2 132, deteriorates the current gain of this part of T2 132. That is, since the N-Well region 104 has the higher doped N+ region 110 disposed therein, the overall current gain $\beta_2$ of the transistor T2 132 is reduced, which may impede (e.g., delay or prevent) the SCR 102 from triggering during an ESD event. Therefore, there is a need in the art for a fast triggering SCR protection device having a reliable and controllable triggering mechanism.

Circuit designers have often found it advantageous to provide circuitry to allow power supply lines to go into a power-down mode, illustratively for power saving purposes. Power-down mode means that one or more of the different supplies can connect to ground, while other supply lines of the IC remain powered. Therefore, portions of IC circuit that are not currently utilized for the functional aspects of the IC may be temporarily powered down to save power, and then the lines are powered up as required.

FIGS. 9A and 9B depict two prior art circuits illustratively providing power line to power line coupling for ESD protection between the power lines. Referring to FIG. 9A, first and second power lines $902_1$ and $902_2$ are coupled by "anti-parallel" (i.e., anti-parallel) diodes $906_1$ and $906_2$. The first and second power lines $902_1$ and $902_2$ illustratively have a voltage potential above ground 904 during normal circuit operation. Since the anti-parallel diodes $906_1$ and $906_2$ are coupled in parallel between the first and second power lines $902_1$ and $902_2$, if one of the power lines 902 goes to ground 904, then one of the diodes 906 will become forward-biased, conduct, and essentially shunt the other supply line also to ground 904. For example, if the first power line $902_1$ is powered down to ground 904, the exemplary diode $906_2$ will become forward biased, conduct, and effectively shunt the current from the second power line $902_2$ to ground 904. Accordingly, the anti-parallel diodes 906 between the power lines 902, as illustratively shown in FIG. 9A, do not provide a solution that is compatible with a "power down mode". Such a "power down mode" is present on integrated circuits when parts of the circuitry are powered down for reasons of limiting energy consumption.

FIG. 9B depicts an NMOS device 908 coupled between two power lines $902_1$ and $902_2$ providing ESD protection that is compatible with a power down mode during normal circuit operation. In particular, a source of the NMOS device 908 is illustratively coupled to a first power line $902_1$, while a drain of the NMOS device 908 is coupled to second power line $902_2$. Furthermore, the gate and P-substrate of the NMOS device 908 are coupled to ground 904. The N+ regions disposed in the P-substrate form the source and drain regions of the NMOS device 908. It is noted that the drain and source regions of the NMOS device 908 are symmetrical and exchangeable depending on the applied voltage polarity.

Furthermore, N+ regions and the P-substrate collectively form a parasitic bipolar transistor, where the N+ to P-substrate junctions form reversed biased diodes 910, as illustratively shown as diodes $910_1$ and $910_2$ (drawn in phantom). In an instance where one of the power lines is grounded, the other power line will not be shunted to ground 904 because of the reverse biased diode 910 formed by the corresponding N+ region and P-substrate.

Specifically, if one of the power lines 902 is powered down to ground 904, while the other power line is still powered up, the lateral parasitic NPN transistor of the symmetrical NMOS device 908 will always have one of the N+ to P-substrate junctions reverse biased. For example, if the first power line $902_1$ is powered down to ground 904, while the second power line $902_2$ is still powered up, the reverse bias diode $901_1$ formed by the lateral parasitic NPN transistor of the NMOS device 908, will prevent the first power line $902_1$ from shunting current to ground 904. It is noted that since the P-substrate and the gate of the NMOS device 908 are connected to ground 904, the NMOS current between the drain and the source is shut off.

Although the NMOS-based ESD protection device 908 of FIG. 9B is power down compliant, the NMOS device 908 has poor ESD voltage clamping characteristics. Furthermore, the NMOS ESD protection device 908 is not area-efficient, and therefore encumbers manufacturing techniques that attempt to further reduce the size of the ICs. Therefore, there is a need in the art for an ESD protection circuit that provides improved ESD voltage clamping between power lines, wherein the power lines are allowed to operate in a power down mode of operation, while having a very high ESD protection performance and high area-efficiency.

SUMMARY OF INVENTION

The disadvantages heretofore associated with the prior art are overcome by the present invention of an electrostatic discharge (ESD) protection circuit in a semiconductor integrated circuit (IC) having protected circuitry. In one embodiment, the ESD protection circuit includes a silicon controlled rectifier (SCR) having at least one first type high dopant region coupled to a first reference potential of the protected circuitry, and at least one second type high dopant region coupled to a second reference potential of the IC. The SCR is triggered by an external on-chip triggering device, which is adapted for injecting a trigger current into at least one gate of the SCR.

In another embodiment, the at least one gate comprises at least one trigger-tap, which is disposed proximate to at least one of the first type high dopant regions and the second type high dopant regions. Further, the external on-chip triggering device is coupled between said protected circuitry and said at least one trigger-tap. In yet another embodiment, an external on-chip resistor is coupled between the first type high dopant region and/or the second type high dopant region of the SCR, and the external on-chip triggering device. These and other embodiments of the present invention may be readily ascertained by the drawings and detailed description of the embodiments described below.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

The process steps and structures described below do not form a complete process flow for manufacturing integrated circuits (ICs). The present invention can be practiced in conjunction with integrated circuit fabrication techniques currently used in the art, and only so much of the commonly practiced process steps are included as are necessary for an understanding of the present invention. The figures representing cross-sections and layouts of portions of an IC during fabrication are not drawn to scale, but instead are drawn so as to illustrate the important features of the invention. Furthermore, where possible, the figures illustratively include a schematic diagram of the circuitry (e.g., an SCR circuit) as related to the P and N-type doped regions of the integrated circuit.

The present invention is described with reference to CMOS devices. However, those of ordinary skill in the art will appreciate that selecting different dopant types and adjusting concentrations allows the invention to be applied to NMOS, PMOS, and other processes that are susceptible to damage caused by ESD.

Figure 2A:
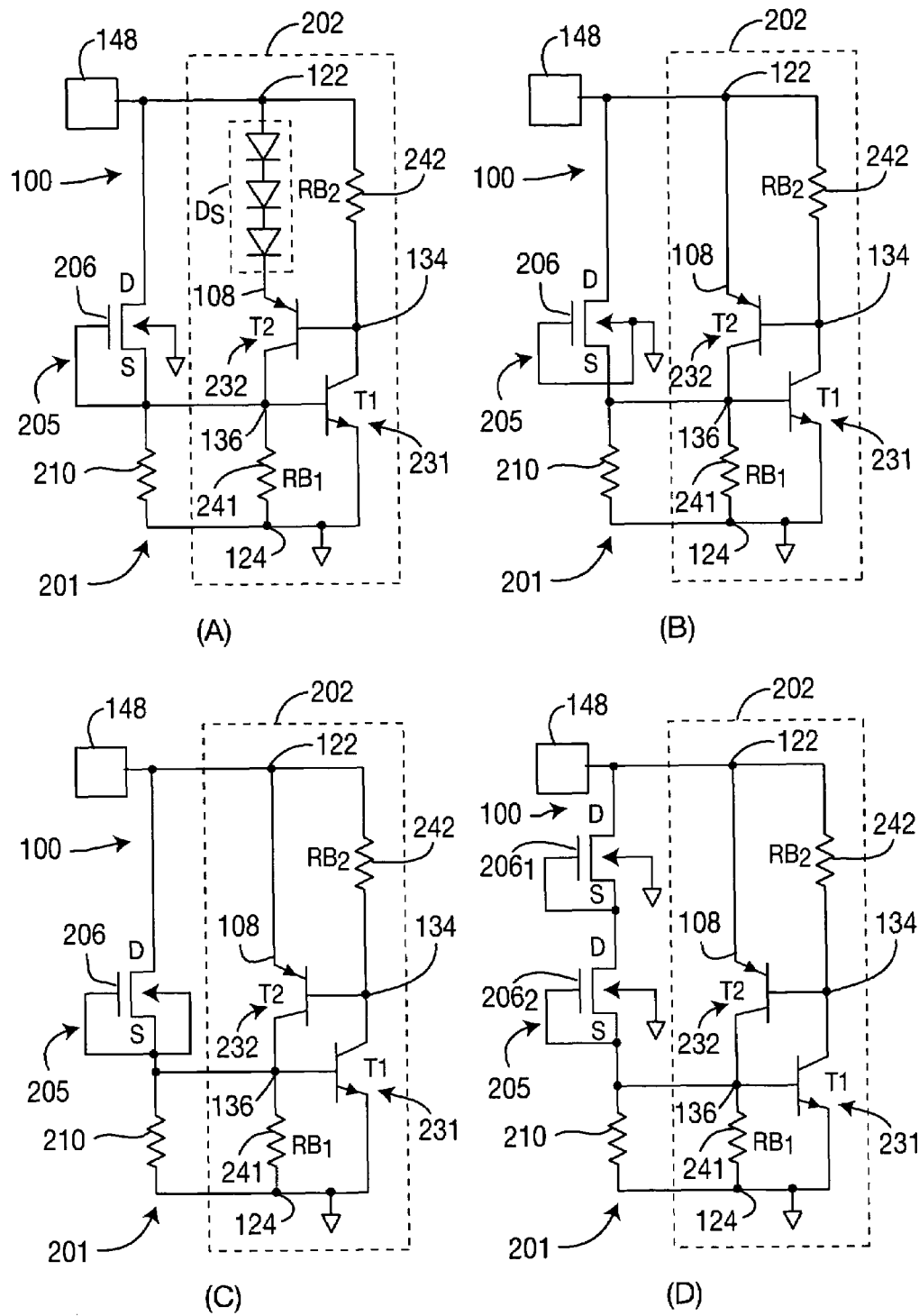
FIG. 2A depicts four illustrative schematic diagram embodiments of a NMOS triggered SCR ESD protection device of the present invention.

FIG. 2A depicts four illustrative schematic diagram embodiments (A-D) of a NMOS triggered SCR ESD protection device 201 of the present invention. Each of the embodiments in schematic diagrams A-D illustratively depicts an IC pad 148 coupled to a trigger device 205 and an SCR 202. An optional current limiting resistor $R_L$ may be positioned between the circuitry to be protected and the SCR ESD protection device 201. The triggering device 205 and SCR 202 together serve as a protection device for the circuitry on an integrated circuit (IC) 200. In particular, the triggering device 205 and SCR 202 protect the IC circuitry from electrostatic discharges (ESD) that may occur at the pad 148, which is coupled to the IC circuitry. When turned on, the SCR 202 functions as a shunt to redirect any ESD currents from the pad 148 to ground. The trigger device 205 turns on, that is, "triggers" the SCR 202 to quickly dissipate such over-voltage ESD condition.

Referring to the schematic diagram A of FIG. 2A, the SCR protection device 201 includes an anode 122, which is connected to the pad 148 and optionally to one side of a resistor $R_{B2}$ 242. The resistor $R_{B2}$ 242 represents a N-Well resistance in a base of a transistor T2 232 of the SCR 202, which is discussed in further detail below. Additionally, the anode 122 is coupled to an emitter 108 of a PNP transistor T2 232, which is parallel to the N-Well resistance $R_{B2}$ 242. Optionally, a number of diodes $D_S$ (drawn in phantom) may be coupled between the anode 122 and the emitter 108 of the PNP transistor T2 232. The serially connected diodes $D_S$ (typically 1-4 diodes) are optionally provided to increase the holding voltage of the SCR, as may be required to fulfill latch-up specifications.

A first node 134 includes the base of the PNP transistor T2 232, the other side of the resistor $R_{B2}$ 242, and the collector of a NPN transistor T1 231. Additionally, the collector of the PNP transistor T2 232 is connected to a second node 136, which is also connected to the base of the NPN transistor T1 231, as well as to one side of a resistor $R_{B1}$ 241, and into the trigger 205 (discussed below). The other side of resistor $R_{B1}$ 241 is connected to a third node 124, which is grounded and serves as the cathode. The resistor $R_{B1}$ 241 represents a substrate resistance in a base of a transistor T1 231 of the SCR 202, which is discussed in further detail below. Furthermore, the emitter of the PNP transistor T1 231 is also connected to the grounded third node 124, which functions as a cathode.

The triggering device 205 in the schematic diagram A includes a NMOS transistor 206, where the gate is connected to the source and an external resistor 210. Specifically, the drain of the NMOS transistor 206 is coupled to the pad 148, the gate is connected to the source to turn off any MOS current, and the source and the gate of the NMOS transistor 206 are coupled to the second node 136 in the SCR 202. Furthermore, the resistor 210 is coupled to the second node 136 on one end, and to the third node 124 on the other end. That is, the resistor 210 is external to the SCR transistors T1 231 and T2 232, and is provided in parallel to the intrinsic resistance $R_{B1}$ 241 of the P-substrate 103 when no P-well is present, or the P-well 104. The resistor 210 is selected with a resistance value that is lower than the inherent base resistance $R_{B1}$ 241, and serves as a shunt resistor for directing small amounts of current to ground. Therefore, resistor 210 provides a path for undesirable leakage currents between the source of the trigger device 205 and ground, which otherwise might unintentionally trigger the SCR 202. Furthermore, as recognized by those skilled in the art, the resistor 210 will control the so-called holding current of the SCR.

The remaining three schematics depicted in diagrams B-D of FIG. 2A are the same, except that the trigger device 205 is shown in various embodiments. For example, in schematic B, a NMOS transistor is provided with drain-bulk-gate coupling, i.e. the local bulk (P-well) and gate are connected and drain to bulk coupling is achieved by the drain to bulk capacitance (not shown in the figure). In schematic C, the NMOS is in an isolated P-well, and in schematic D, two cascoded NMOS transistors $206_1$ and $206_2$ are used as part of the triggering device 205. Furthermore, one skilled in the art will recognize that other triggering devices and configurations may be implemented, which are external to the SCR 202.

Figure 1A:
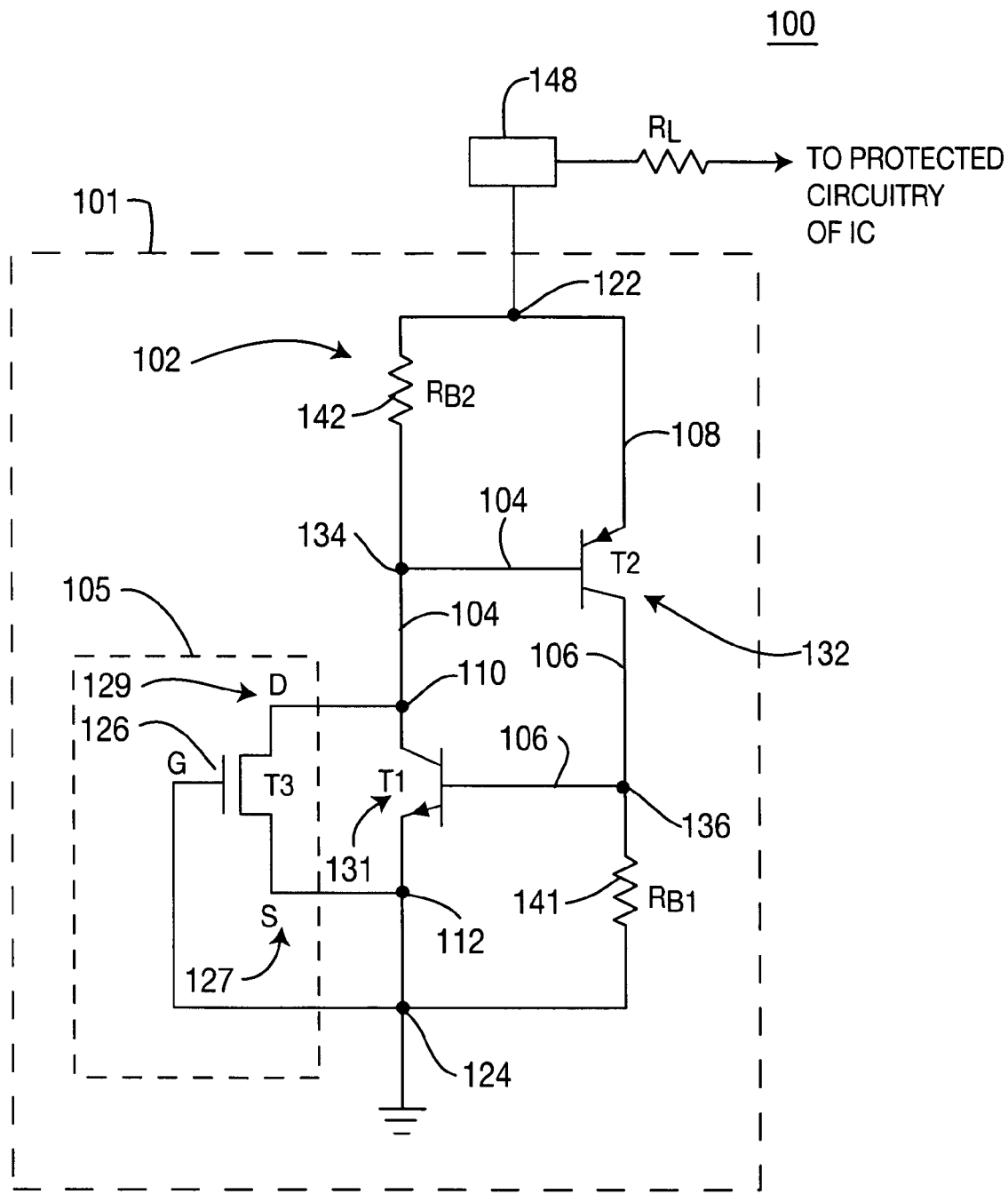
FIG. 1A depicts a schematic diagram of a prior art SCR included within an integrated circuit to provide ESD protection.

The coupled trigger NMOS transistor 206 (as shown in the schematics of FIG. 2A) allows the SCR 202 to turn on faster than the prior art LVTSCR device (see FIG. 1A). Specifically, the drain of the NMOS transistor 206 is no longer coupled to the collector of the NPN transistor T1 231 (also, base of the PNP transistor T2 232), which was used to provide a reverse biased breakdown voltage between the N+ region 110 (base) of the PNP transistor T2 232 and the P-well region 120 (base) of the NPN transistor T1 231. Rather, the drain is coupled to the pad 148, while the source and the gate of the NMOS transistor 206 are coupled directly to the base of the NPN transistor T1 231, which is discussed below in detail with regard to FIGS. 3 and 4.

Figure 2B:
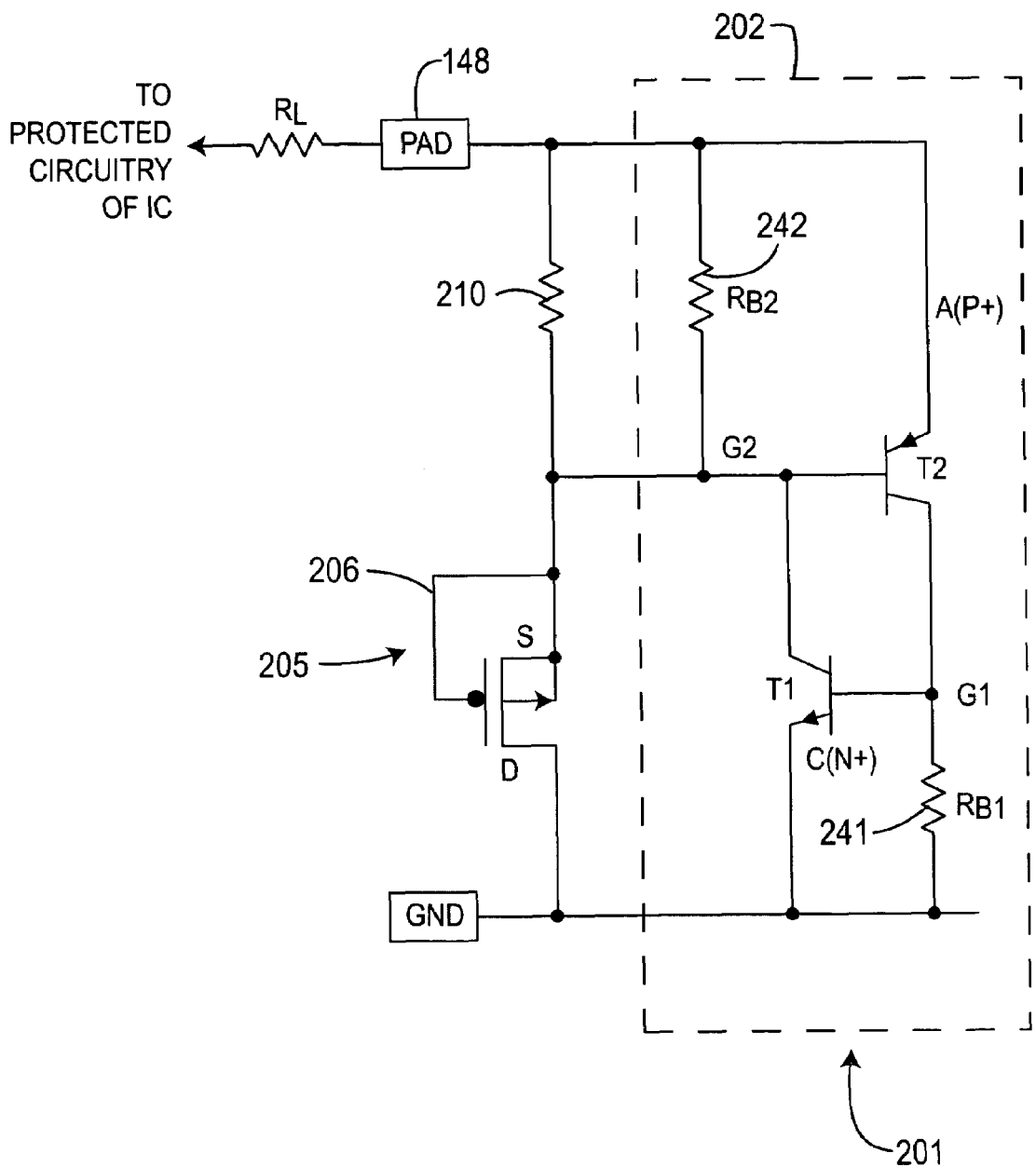
FIG. 2B depicts an illustrative schematic diagram of a PMOS triggered SCR ESD protection device of the present invention.

Furthermore, a person skilled in the art for which this invention pertains will understand that a PMOS triggered SCR ESD protection device may also be utilized. For example, FIG. 2B depicts an illustrative schematic diagram E representing a PMOS triggered SCR ESD protection device 201 of the present invention. Furthermore, a person skilled in the art will recognize that a PMOS transistor with drain-bulk-gate coupling, or two cascoded PMOS transistors, or other external triggering devices 205 may be used as part of ESD protection device 201, as discussed above. For purposes of clarity, the invention will be discussed as a NMOS triggered SCR, as illustratively depicted in the schematic diagram A of FIG. 2A.

Figure 3:
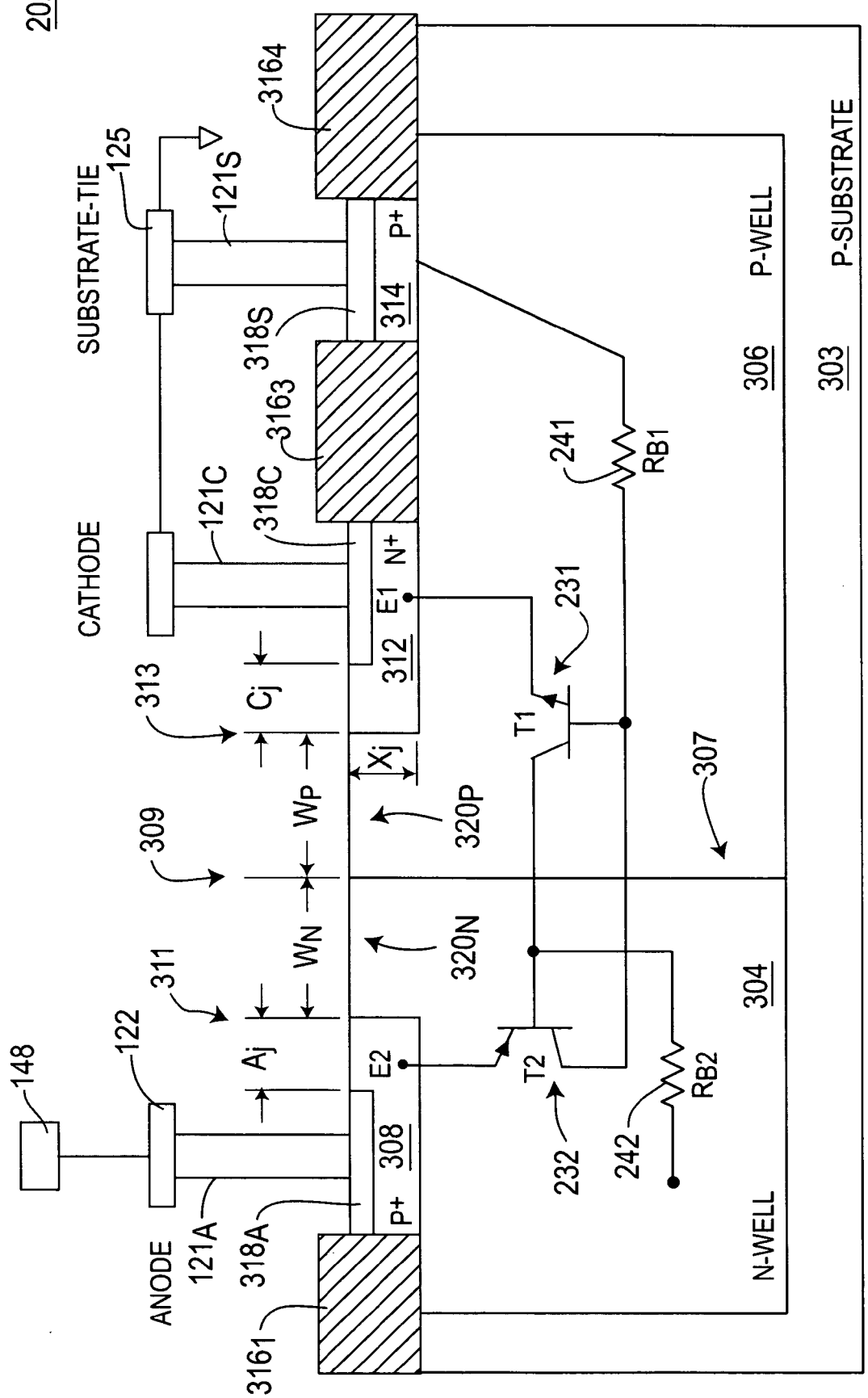
FIG. 3 depicts a cross-sectional view of a first embodiment of a SCR of the NMOS or PMOS-triggered SCR ESD protection device of FIGS. 2A and 2B.

FIG. 3 depicts a cross-sectional view of a SCR 202 of the NMOS-triggered SCR ESD protection device 201 of FIGS. 2A and 2B. Specifically, the protection device 201 includes in part, a P-type substrate 303, into which an N-Well 304 and P-well 306 is formed. The N-Well 304 and P-well 306 are adjacent to each other and form a junction 307 at the adjoining boundary. Within the N-Well 304, a first P+ region 308 is formed. Furthermore, within the P-well 306, a single N+ region 312 and a second P+ region 314 are formed thereupon. The regions denoted P+ and N+ are regions having higher doping levels than the N-Well and P-well regions 304 and 306. Furthermore, it should be noted that there is no "second N+ region 110" formed over and overlapping the junction 307 between both the P-well 304 and N-Well 306 regions, as shown in the prior art of FIG. 1B.

The illustrative schematic diagram in FIG. 3 represents the components of the SCR 202, which correspond to the schematic diagrams in FIG. 2A. That is, FIG. 3 is illustrated and discussed as an SCR for an NMOS triggering device with the source and gate connected together. However, a person skilled in the art will understand that where a PMOS triggering device is used, the N- and P-type regions illustratively shown in FIG. 3 as well as the potentials and terminals are reversed. Referring to FIG. 3, the NPN transistor T1 231 is formed by the N+ region 312 (emitter), the P-well 306 (base) and the N-Well 304 (collector). The PNP transistor T2 232 is formed by the P+ region 308 (emitter), the N-Well region 304 (base), and the P-well region 306 (collector). It should be noted that the N-Well 304 serves dual functions as the collector of the NPN transistor T1 231, as well as the base of the PNP transistor T2 232. Likewise, the P-well 306 serves dual functions as the collector of the PNP transistor T2 232, as well as the base for the NPN transistor T1 231. The second P+ region 314 forms the substrate-tie 125, which is usually connected to the cathode 124 and grounded.

The P-well 306 has an intrinsic resistance, which is observed as the well/substrate or as the base resistance $R_{B1}$ 241 of the NPN transistor T1 231. The well/substrate resistance $R_{B1}$ 241 appears between the substrate-tie 125 (which includes the P+ region 314) and the intrinsic base node of transistor T1 231. Likewise, the N-Well 304 has an intrinsic resistance, which is observed as the base resistance $R_{B2}$ 242 of the PNP transistor T2 232. The N-Well or base resistance $R_{B2}$ 242 appears between the intrinsic base node of transistor T2 232 and an optional N-Well tie (not shown in FIG. 3) that would be formed by a N+ doped region in the N-Well 304. This N-Well tie is optional, but it is left out (shown floating in FIG. 3) because it does not contribute to the function of the device. As such, the N-Well tie is only needed for the PMOS triggered SCR having an N-Well trigger tap G2 (see schematic diagram E of FIG. 2B). For either N-Well or P-type substrates, the associated resistance is an inherent resistance. The well or substrate resistance value depends on the doping levels, as well as the length and cross sectional area of the N-Well 304 and of the P-well 306/P-substrate 303. Typically, the well/substrate resistance $R_{B1}$ 241 and $R_{B2}$ 242 (if an N-Well tie is provided) have resistance values in a range of 500 to 5000 ohms for a silicon material.

Figure 6:
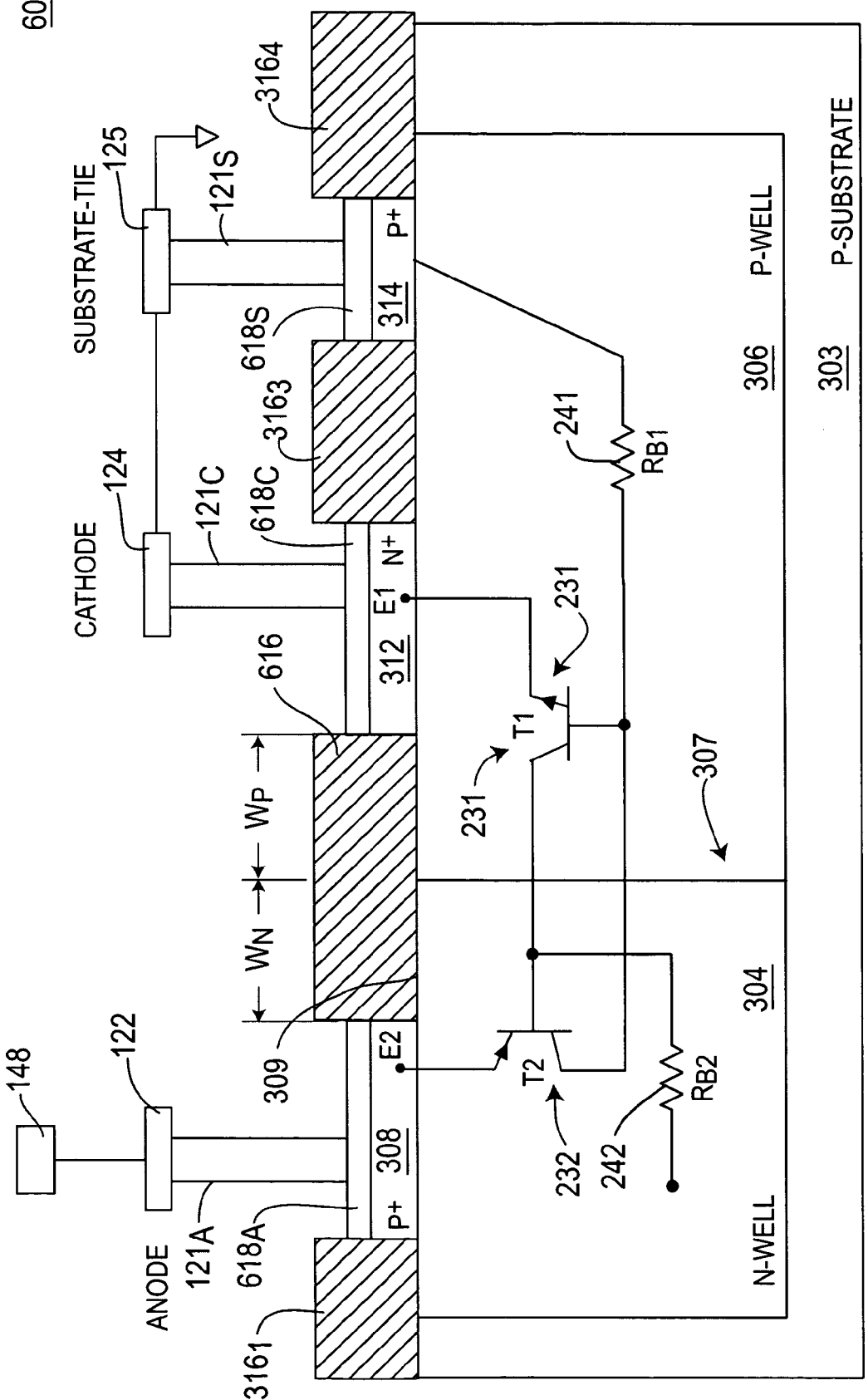
FIG. 6 depicts a cross-sectional view of a second embodiment of a SCR of the NMOS or PMOS-triggered SCR ESD protection device of FIGS. 2A and 2B.

Shallow trench isolation (STI) is used to separate regions that will receive high doping (e.g., regions 308, 312, and 314) as illustrated in FIG. 6. In particular, trenches are etched in specific areas, and an insulator material (e.g., silicon dioxide ($SiO_2$)) is illustratively deposited. The regions 308 and 312 may also be separated by other techniques known in the art, which are beneficial to the SCR operation.

N+ and P+ implant and annealing steps are conducted after the STI region formations to form the high-doped N+ and P+ regions, respectively. The implantations are done through separate photo masks for the N+ and P+ to allow the dopants to penetrate only into the dedicated regions of the IC 200.

Furthermore, a silicide layer 318 is formed over the N+ region 312 and P+ regions 308 and 314. In particular, a conductive layer (e.g., using cobalt, titanium, and the like) is formed on the surface of the IC 200. A silicide blocking-mask is provided to block unwanted silicide layers over certain areas of the IC. The remaining silicide layers $318_A$, $318_B$, and $318_C$ serve as a conductive material respectively between each metal contact $121_A$, $121_C$, and $121_S$ (collectively metal contacts 121) at the anode 122, cathode 124, and substrate-tie 125. By using the silicide layers 318 only in certain parts of region 308 (for the anode 122) and region 312 (for the cathode 124), the risks of a shorting between the anode 122 and the surface of region $320_N$, and between the cathode 124 and the surface of region 320$_P$ (e.g., from thermal and mechanical stresses) is greatly reduced.

Specifically, looking from left to right in FIG. 3, a first STI region 316$_1$ is formed to the left of the first P+ doped region 308. Furthermore, a second STI region 316$_3$ is formed between the first N+ region 312 and the second P+ region 314, and a third STI region 316$_4$ is formed to the right of the second P+ region 314. As such, a surface region 309, which is located between the anode 122 and cathode 124, does not have any trench etched, high-doped regions, or insulative material deposited therebetween. Thus, the embodiment of FIG. 3 is different from the prior art (see STI region 116$_2$, N+ region 110, and the oxide layer 130 of FIG. 1A). Accordingly, the entire device cross-section including the surface region 309, which extends over an N-Well region 320$_N$ and a P-well region 320$_P$ (collectively non-high-doped region 320), may be utilized for SCR conduction.

Each of the high-doped regions (i.e., N+ region 312, and P+ regions 308 and 314) has a depth having a value "$X_j$", which is defined by the underlying semiconductor technology. In one embodiment, the depth $X_j$ is in the range of 0.1 to 0.3 microns. Additionally, the distance from the silicided anode to the anode edge 311 has a length "$A_j$". Likewise, the distance from the silicided cathode 124 to the cathode edge 313 has a length "$C_j$". The lengths $A_j$ and $C_j$ are maintained within a particular range to reduce the possible detrimental impact of mechanical stress during the formation of the silicide 318, which could later lead to increased leakage currents.

In particular, the physical lengths $A_j$ and $C_j$ are proportionally based on the height $X_j$ of the P+ and N+ doped regions 308 and 312. The lengths $A_j$ and $C_j$ are in the range of two to five times the depth of the doped regions, where $A_j$ and $C_j$ are approximately equal. That is, $A_j$ and $C_j$ have values approximately in the range of $2X_j$ to $5X_j$. Preferably, the distance from the silicided anode to the anode edge $A_j$ and distance from the silicided cathode to the cathode edge $C_j$ is equal to approximately three times the height $X_j$ of the doped regions 308 and 312. By maintaining such distances between the anode 122 and junction 307, as well as the cathode 124 and junction 307, the probability of stress related leakage currents and shorting of the silicide layers 318 is greatly reduced.

One objective of the present invention is to increase the speed in which the SCR 202 turns on. Recall that in the prior art, the N+ doped region 110 reduced the gain of the PNP transistor of the SCR because of the high recombination of the hole-electron pairs. Decreasing the turn on time of the SCR 202 is realized by two particular differences over the prior art. The first difference is a reduction in the size of the respective base regions of the transistors T1 231 and T2 232 in the SCR 202. The dimensions W$_P$ and W$_N$ in FIG. 3 represent the respective base widths of the NPN transistor T1 231 and the PNP transistor T2 232. The base widths W$_N$ and W$_P$ are respectively measured from the edge 311 of the P+ region 308 to the junction 307, and from the edge 313 of the N+ region 312 to the junction 307. Reducing the size (i.e., base width) of the base of each transistor T1 231 and T2 232 of the SCR 202 reduces the time it takes for the minority carriers to diffuse through these regions and reach the corresponding collector regions. The transistors T2 232 and T1 231 preferably have as small as possible (as permitted by the semi-conductor process specifications) base widths W$_N$ and W$_P$. For example, the base widths W$_N$ and W$_P$ are less than 4.0 microns, and in one embodiment, the base widths W$_N$ and W$_P$ are both in a range of 0.6 to 0.8 microns.

The SCR turn on time (SCR$_{Ton}$) is proportionally related to the combined base widths of each SCR transistor T1 231 and T2 232. In particular, the turn on time T$_{on1}$ for the NPN transistor T1 231 is proportionally related to the square of the base width W$_P$ of the NPN transistor T1 231. Likewise, the turn on time T$_{on2}$ for the PNP transistor T2 232 is proportional to the square of the base width W$_N$ of the PNP transistor T2 232. As such, the turn on time of the SCR$_{Ton}$= $((T_{on1})^2+(T_{on2})^2)^{1/2}$. Accordingly, since the base widths have been reduced compared to the prior art, the turn on time SCR$_{Ton}$ has also been reduced.

Figure 1B:
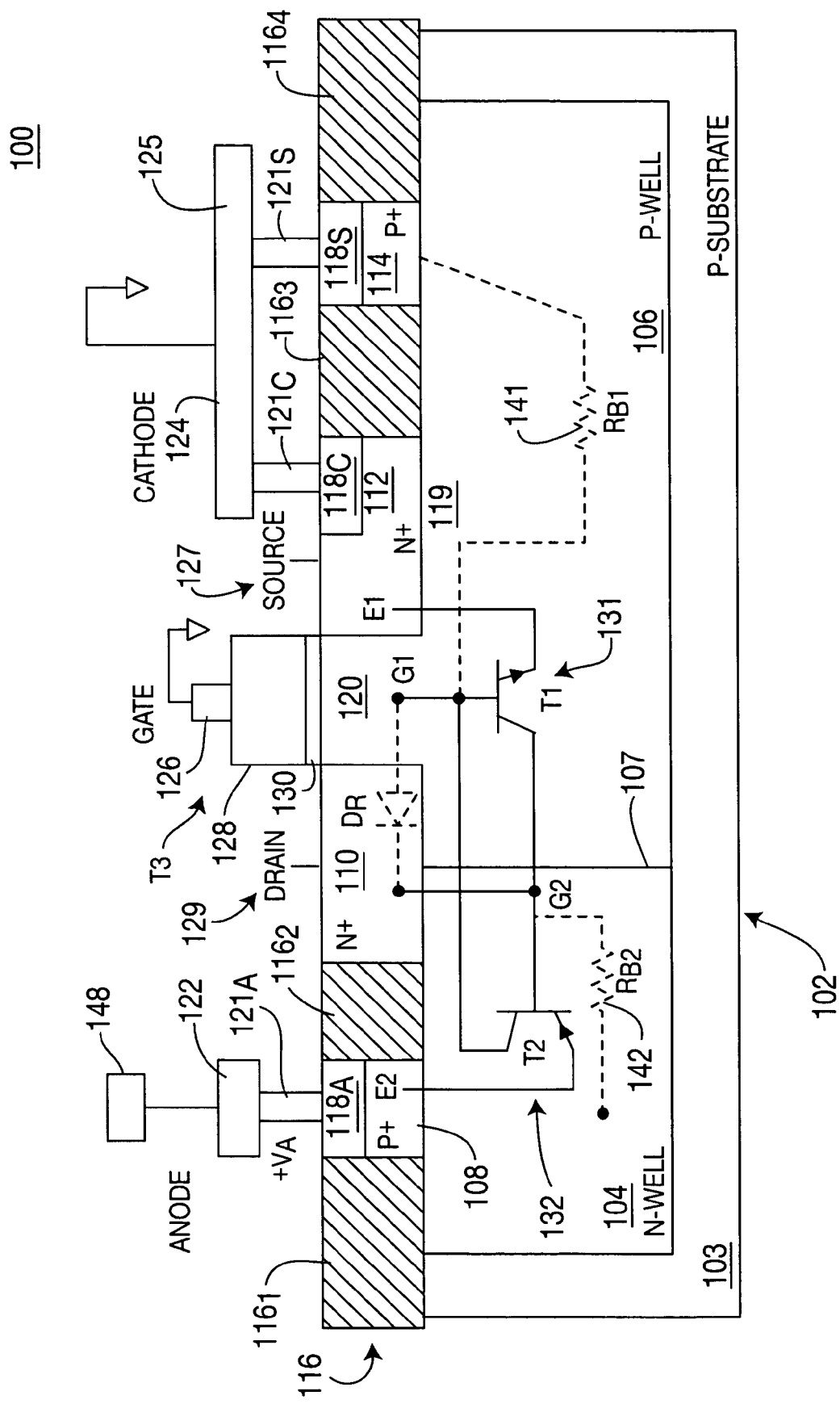
FIG. 1B depicts a cross-sectional view of a prior art low voltage triggering SCR (LVTSCR) device of FIG. 1A.

The second difference over the prior art is the eliminated second N+ region 110. This reduces the overall doping level of the transistor T2 232 base (N-Well 304). As such, the N-Well 304, in the embodiment of FIG. 3, is able to provide an increase in current gain to the PNP transistor T2 232 of the SCR 202, since less electron-hole pairs will recombine during diffusion in the base region. The illustrative embodiment of FIG. 3 should be compared with the prior art of FIG. 1B. Referring to FIG. 1B, the high-doped N+ region 110 forms a part of the base of the PNP transistor T2 232, and thereby decreases the overall gain of the PNP transistor T2 232. This N+ region 110 provides high recombination of the minority carriers (holes) with the majority carriers (electrons), thereby resulting in the low amplifying characteristics of the transistor T1 231. Yet another problematic aspect with the prior art of FIG. 1B is the fact that the N+ region 110, the P-region 120, and the N+ region 112 form a relatively good lateral parasitic bipolar transistor close to the surface (not shown), as compared to the NPN transistor T1 231, which is situated deeper in the substrate/P-well 106. This surface NPN transistor is very well coupled through the common highly doped N+ region 110 to the deteriorated (surface) part of the PNP transistor T2 232. The prior art SCR device of FIG. 1B tends to remain in a state where only this parasitic surface NPN transistor conducts in the snap-back mode. Furthermore, the PNP transistor T2 232 acts only as a forward biased base-emitter diode, while the deeper NPN transistor in the substrate (with lower current gain) does not trigger. As such, the prior art SCR device does not fully operate in the desired SCR mode due to its geometrical deficiencies. The prior art typically has 10% lower current handling capability. Additionally, due to the larger geometry, the prior device does not trigger safely and fast enough to protect very sensitive circuit elements.

Referring to FIG. 3, the shortening of the widths W$_N$ and W$_P$ of the transistor bases, as well as the elimination of the N+ region 110 decreases the trigger speed. Furthermore, the shortened widths W$_N$ and W$_P$ increase the overall gain of the transistors T1 231 and T2 232 in the SCR 202 by decreasing the hole-electron recombination effect caused by the presence of the N+ region 110. The increased transistor current gains β help ensure that enough current is provided to forward bias the bases of each transistor T1 231 and T2 232, and thereby quickly and reliably activate the SCR 202.

Figure 4:
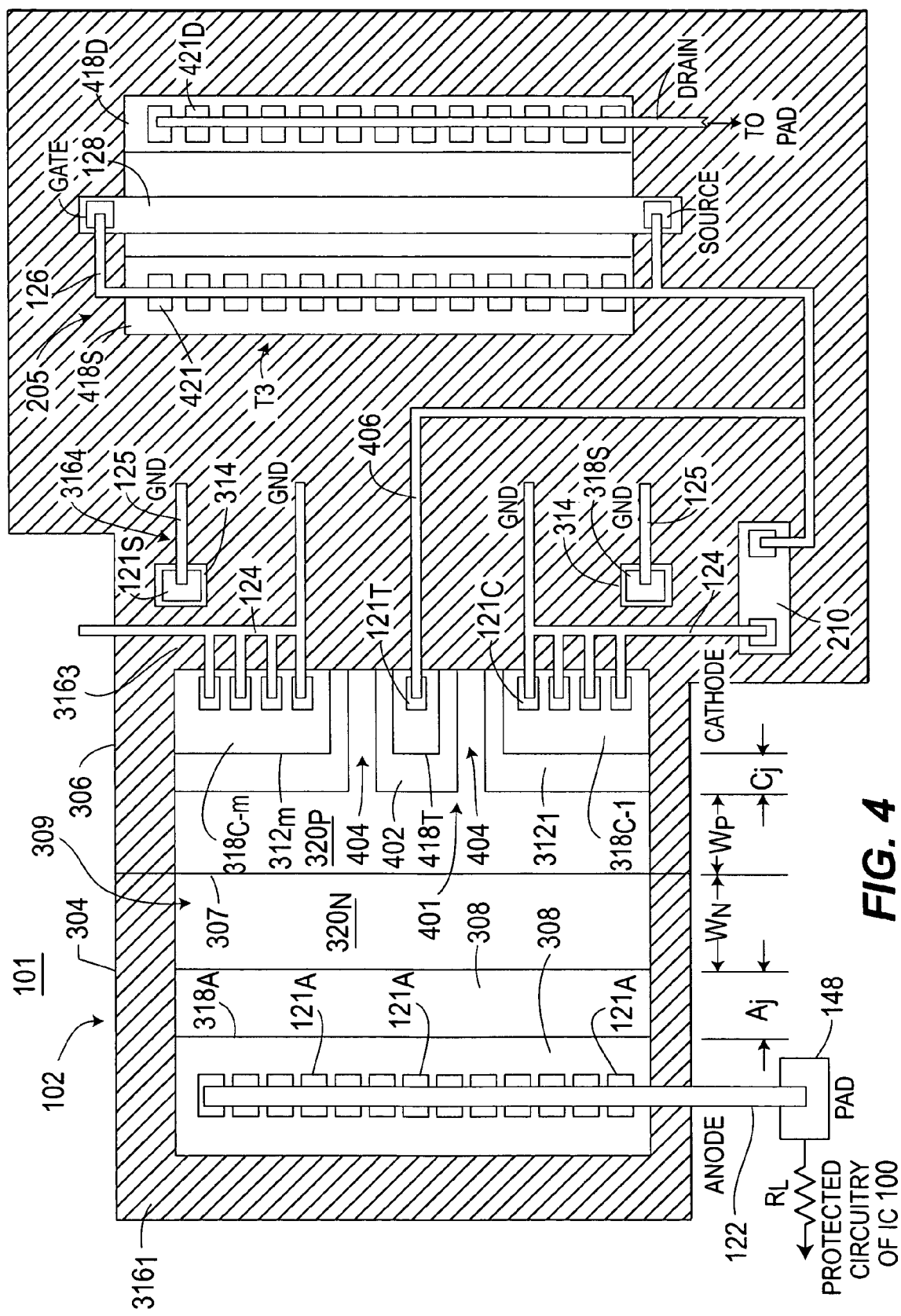
FIG. 4 depicts a top view of the first embodiment of the NMOS-triggered SCR ESD protection device of FIG. 2A.

The cross-sectional view in FIG. 3 illustratively depicts only the SCR 202 portion of the SCR ESD protection device 201, and does not depict the triggering device 205 of the present invention shown in FIG. 2. However, FIG. 4 illustratively depicts the triggering device 205 in conjunction with the SCR 202 of FIG. 3. Specifically, FIG. 4 depicts a top view of the NMOS-Triggered SCR ESD protection device 201 of FIG. 2A, and should be viewed along with FIG. 3.

In particular, FIG. 4 represents a top view of a portion of an integrated circuit 200 in which the triggering device 205 is external to the SCR 202, as compared to the prior triggering device 105 (see FIGS. 1A and 1B) being internal to the SCR 102. Furthermore, although the triggering device 205 and SCR 202 appear to be separate and distinct devices, they both are incorporated onto the same IC 200, and may be one of a plurality of ESD protection devices 201. In fact, a typical IC has numerous pads 148 that are each coupled to the internal circuitry of the IC. As such, each of the pads 148 in the IC preferably has an ESD protection device 201, such as a NMOS triggered SCR, coupled thereon.

Referring to FIG. 4, the top view of the SCR 202 depicts the N-Well region 304 and the P-well region 306. In particular, a single P+ region 308 in the N-Well 304 forms the anode 122. A plurality of metal contacts $121_A$ connect the anode 122 to the pad 148. The pad 148 is also coupled to the protected circuitry of the IC 200, optionally through the current limiting resistor $R_L$. A portion of the P+ region 308 beneath the metal contacts $121_A$ is covered by the silicide $318_A$ as discussed above in reference to FIG. 3. Furthermore, the distance $A_j$ as discussed above is also shown in FIG. 4.

The cathode 124 is formed from N+ regions $312_1$ through $312_m$ (collectively N+ region 312). A plurality of metal contacts $121_C$ connects the cathode 124 to ground. A portion of each (interspersed) N+ region $312_m$ beneath the metal contacts $121_C$ is covered by a corresponding silicide layer (e.g., silicide layers $318_{C-1}$ and $318_{C-m}$) as discussed above in reference to FIG. 3. Furthermore, the distance $C_j$ is also shown in FIG. 4.

Disposed in the vicinity of the N+ regions 312 is a trigger tap 401. The trigger tap 401 is formed by a P+ region 402 having a silicide layer $418_T$ disposed over a portion of the P+ region 402, and one or more metal contacts $121_T$ disposed over the silicide layer $418_T$. Furthermore, the illustrative trigger tap 401 may be one of a plurality of trigger taps, with a P-well spacing 404 defined therebetween.

Specifically, the P+ region 402 of the trigger tap 401 is disposed in close proximity to the N+ regions 312. Preferably, the trigger tap 401 is also aligned with the N+ regions 312. By disposing the trigger tap 401 in close proximity to the N+ regions 312, the base resistance from the trigger tap to the intrinsic base node of the NPN transistor T1 231 is reduced. The P-well spacing 404 is defined by the P-well material 306 and is preferably minimal in size. The P+ region 402 of the trigger tap 401, combined with the adjacent P-well spacing 404 and the N+ regions 312 together form a diode, which is forward biased when a positive voltage appears on the P+ region 402.

In particular, the triggering device 105 acts as a current source at the base of the NPN transistor T1 231, by injecting majority carriers (holes) into the P-type base material, which forward biases the base-emitter (P-well spacing/region 404/306 and N+ 312) of the NPN transistor T1 231. Furthermore, for normal circuit operation (i.e. no ESD event), the close proximity of the trigger tap 401 to the SCR 202 and the N+ emitter regions 312 of the SCR 202 is advantageous as will be described in hereafter. Unintended triggering of an SCR by certain circuit over-voltage conditions is known to disrupt the circuit (e.g., cause a Latch-Up condition). As the trigger tap is grounded through the shunt resistor 210, the P-well 306 of the SCR receives additional coupling to ground, which will prevent Latch-Up.

The STI regions 316 circumscribe the SCR 202 and the trigger device 205 such that the anode 122, cathode 124, and portions of the SCR 202 therebetween are not covered with the STI material as discussed above with regard to FIG. 3. In particular, the doped P+ region 308, intermittent N+ regions 312, the surface area 309 between the P+ and N+ doped regions 308 and 312, the trigger taps 401, and the P-well spacing 404 do not have any STI 316 disposed thereupon in this preferred embodiment. However, the P-well spacing 404 may also be covered with STI as only negligible influence on the diodes (402-404-312) takes place. As such, the combination of the area-reduced layout from omitting the N+ region 110 and the gate 126, and the trigger taps 401 introduced in-line with the N+ regions 312 (emitter of the NPN transistor T1 231) results in faster triggering of the SCR 202 of the present invention.

In the embodiment shown in FIG. 4, the grounded local substrate ties 125 are preferably located at maximum distance from the N+ regions 312, and are separated by the STI region $316_3$. Alternately, the SCR 202 may have a closed ring P-substrate tie (not shown) circumscribing the SCR 202 that is grounded. The distance of P-substrate ring from the SCR 202 and the trigger device 205 may be at a range from 2 to 20 um, preferably larger than 5 um. As such, the trigger taps 401 are positioned away from either the closed ring P-substrate tie or the local substrate ties 125 to avoid current leakage to ground. Specifically, the trigger taps 401 are in line and in close proximity to the N+ regions 312, since alternately locating the trigger taps 401 near a grounded P-substrate tie would disadvantageously result in current leakage from the P+ region 402 to ground. Such current leakage to ground subtracts away from the current required to forward bias the transistors in the SCR 202, which may delay or thwart activation of the SCR 202.

In one embodiment, the triggering device 205 is illustratively the NMOS transistor 206. Referring to the schematic diagram A of FIG. 2A along with FIG. 4, the NMOS transistor 206 is an on-chip transistor external to the SCR 202. The drain of the NMOS transistor 206 is coupled to the pad 148. The source of the NMOS transistor 206 is coupled to one end of the resistor 210, as well as to the trigger tap 401 adjacent to N+ regions 312 of the cathode 124. Additionally, the other end of the resistor 210 is also tied to ground. Moreover, the gate 126 of the NMOS device 205 is connected to the source of the NMOS 205 and is effectively coupled to ground through the resistor 210.

The resistor 210 has a selected resistance value in the range of 100 Ohms to 2000 Ohms, which is substantially lower than the inherent resistance of the P-substrate 302 and P-well 306. The latter may be in a range of several kilo Ohms depending on the location of the P+ substrate ties 125. As such, those skilled in the art will appreciate that resistor 210 can easily control the total resistance to ground, and thus control triggering and holding current of the SCR. Furthermore, any leakage currents from the trigger device 205 are shunted to ground via the path through this resistor. In one embodiment, the resistor 210 is fabricated from a silicide-blocked poly-silicon, because the poly-silicon sheet resistance value allows easy dimensioning of the desired resistor value and because the poly-silicon resistor 210 is completely isolated from the substrate 30 by the STI. Moreover, those skilled in the art will understand that any other resistive material that is available in the IC manufacturing process may be used as well.

In the illustrative embodiment shown in FIG. 4, the trigger device 205 (e.g., NMOS trigger) is fabricated from the N+ material, and also features silicide blocking to ensure that the trigger device itself will be ESD robust, while still providing the trigger current to the SCR 202. In particular, silicide layers $418_S$ and $418_D$ are respectively disposed over the source and drain of the NMOS trigger device in areas where the contacts $421_S$ and $421_D$ are positioned.

In operation, the trigger current is provided by the external NMOS trigger device 205, and is injected into the trigger taps 401 of the SCR 202. Specifically, the external triggering current is provided from the source of the NMOS trigger device 205, which goes into breakdown, and subsequently into snapback. The NMOS trigger device 205 ensures a low trigger voltage of the ESD protection element, since the trigger voltage is determined by the drain-substrate breakdown voltage (e.g., 8 volts) of the NMOS transistor 206, and not by the intrinsically high breakdown voltage of the SCR 202 (in the range of 15 to 25V). The trigger current is injected as a base current into the base of the NPN transistor T1 231. As such, the inventive embodiment, as shown in FIGS. 2-4, differs from the prior art LVTSCR of FIGS. 1A and 1B, where the trigger current is injected by an internal source into the base of a slow acting PNP transistor T2 232.

Figure 5:
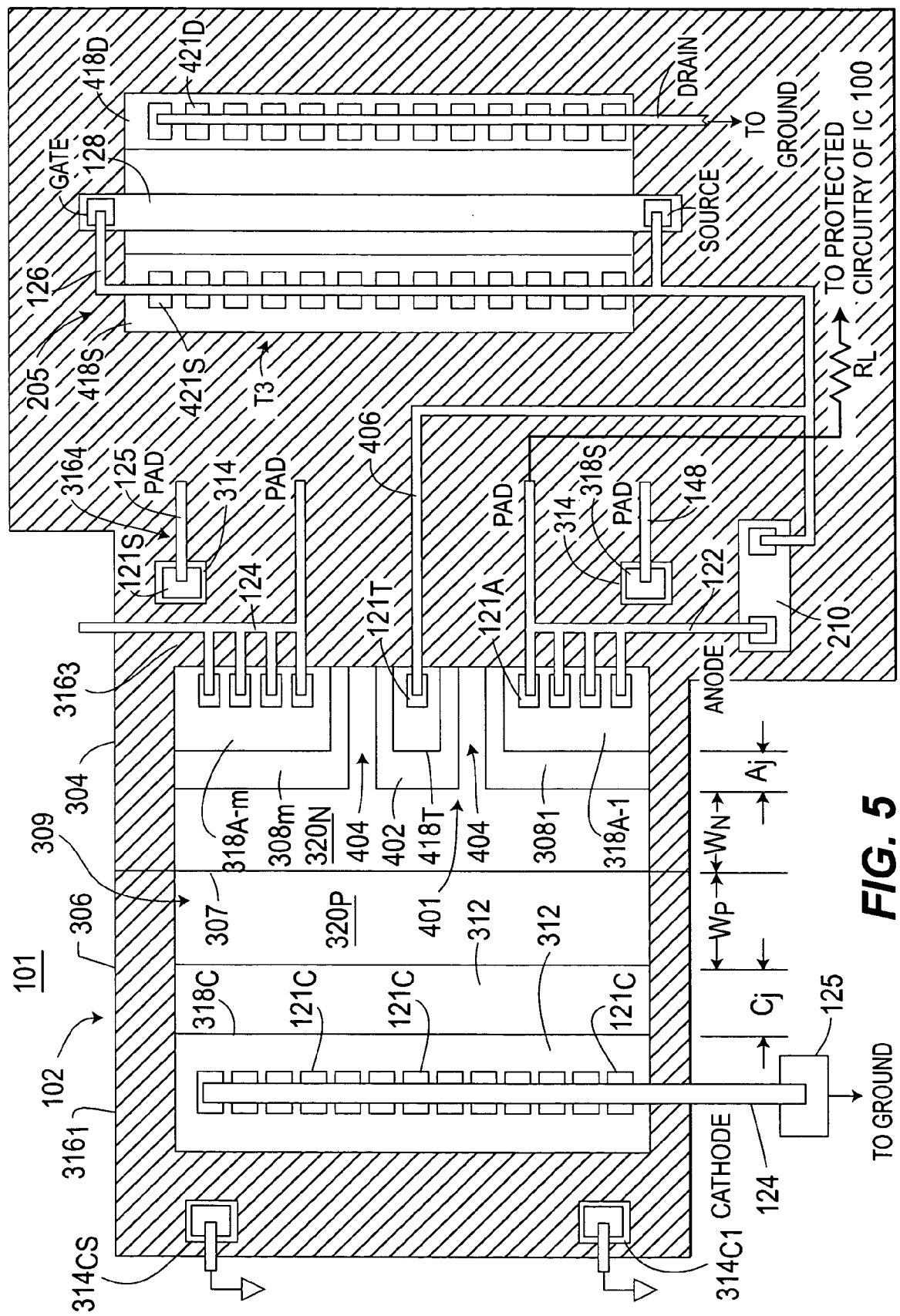
FIG. 5 depicts a top view of a second embodiment of the PMOS-triggered SCR ESD protection device of FIG. 2B.

As discussed above, the inventive trigger device 205 and SCR 202 are respectively depicted as a NMOS triggering device. However, one skilled in the art will recognize that a PMOS triggered SCR structure for ESD protection may be utilized. For purposes of completeness of illustrating the present invention, FIG. 2B depicts an illustrative schematic diagram of a grounded gate PMOS (PMOS) triggered SCR ESD protection device of the present invention, and FIG. 5 depicts a top view of the PMOS-triggered SCR ESD protection device of FIG. 2B. Referring to FIG. 5, the layout of the triggering device 205 and SCR 202 are the same as illustrated in FIG. 4. However, the N-type and P-type materials are reversed. That is, wherever an N+ or N-type material is shown in FIG. 4, a P+ or P-type material is respectively depicted in FIG. 5. Likewise, wherever a P+ or P-type material is shown in FIG. 4, a N+ or N-type material is respectively depicted in FIG. 5. However, the P-substrate 302, as shown in FIG. 3, remains the same for both embodiments of FIGS. 4 and 5. As such, additional P+ substrate ties (e.g., substrate-ties $314_{C1}$ and $314_{CS}$) are placed near the N+ region $318_C$ or a closed P+ substrate ring (not shown) is placed around the entire structure. The PMOS triggering device 205 is fabricated from P+ type material and placed in an N-Well, and the trigger tap 401 is fabricated from a N+ type material, in contrast to the reversed embodiment shown in FIG. 4.

In normal operation of the IC, the PMOS gate is tied high together with the PMOS source through the external resistor 210 such that no MOS-current will flow through the source to drain channel. When a positive ESD event with an excessive voltage occurs at the pad, an avalanche breakdown occurs between the drain and the N-Well junction above a predetermined threshold voltage (e.g., 8 to 10 volts), and the PMOS transistor will operate as a parasitic, lateral PNP transistor. Consequently, current will flow through the PMOS device and the voltage across the source and drain terminals will drop to a lower value. The gate G2 (schematic drawing E in FIG. 2B) is then pulled low, and the SCR 202 turns on. The gate G2 is identical with the trigger taps 401 in FIG. 5. A voltage drop forms across the intrinsic N-Well resistance $R_{B2}$ 242 and across the external resistance 210. Since the external resistance 210 has a resistance value of 100 Ohms to 2000 Ohms, that is much less than the intrinsic N-Well resistance $R_{B2}$ value (500 Ohm to 5000 Ohms), the external resistance 210 functions as a current shunt to control and tune the trigger and holding currents of the SCR 202. As such, the triggering of the ESD protection device 201 shunts the discharge current during a positive ESD event at the pad to ground, and therefore limits the transient voltage drop to a value that is tolerable by the circuitry of the IC 200.

FIG. 6 depicts a cross-sectional view of a second embodiment of a SCR 602 of the NMOS-triggered SCR ESD protection device 201. Specifically, FIG. 6 represents an SCR 202 that is fully silicided over the P+ and N+ regions 308 and 312. The base widths $W_N$ and $W_P$ of the transistors T2 232 and T1 231 are shown, respectively. Furthermore, shallow trench isolation (STI) is disposed over the entire SCR 202 as shown by STI regions $316_1$, 616, $316_3$, and $316_4$. In particular, the STI region 616 is disposed on the surface area 309 between the silicided layers $618_A$ and $618_C$. Accordingly, the STI region 616 serves as an isolator between the anode 122 and cathode 124 to prevent shorting between the respective silicide layers $618_A$ and $618_C$.

Moreover, the respective base widths $W_N$ and $W_P$ of the transistors T2 232 and T1 231 are determined by the length of the STI region 616. In particular, during manufacturing of the IC 200, the STI material is selectively deposited over the SCR 202. Thereafter, the P+ and N+ doped regions 308, 312, and 314 and respective silicide layers $618_A$, $618_C$, and $618_S$ are formed. As discussed with regard to the embodiment of FIG. 3, reducing the lengths (i.e., widths) of the base regions means that the overall distance in which the minority carriers must diffuse through these base regions is reduced. In the second embodiment shown in FIG. 6, the base widths $W_N$ and $W_P$ for the respective transistors T2 232 and T1 231 are typically slightly smaller than in the embodiment depicted in FIG. 3. As such, this second embodiment depicted in FIG. 6 differs from the prior art of FIG. 1B, since the high-doped N+ region 110 from the triggering device 205 is eliminated and very compact dimensions of the SCR can be realized for fast turn on. Moreover, the embodiment depicted in FIG. 6 is an alternative and a further improvement over the embodiment depicted in FIG. 3, because it consumes less silicon area. That is, all high-doped regions 308, 312, 314, and the trigger tap 402 (see FIG. 4) are fully silicided.

Furthermore, by utilizing a triggering device 205, which is also fully silicided and covered with the STI, wafer processing costs may be reduced because the additional and costly procedure of silicide blocking is not required. In particular, a back-end-ballasted, NMOS (BEBNMOS) device may be used as triggering device. Such BEBNMOS device is disclosed in U.S. application Ser. No. 09/583/141, entitled "Apparatus For Current Ballasting ESD Sensitive Devices", Attorney Docket SAR13663, filed May 30, 2000, and is incorporated by reference herein in its entirety.

Figure 7:
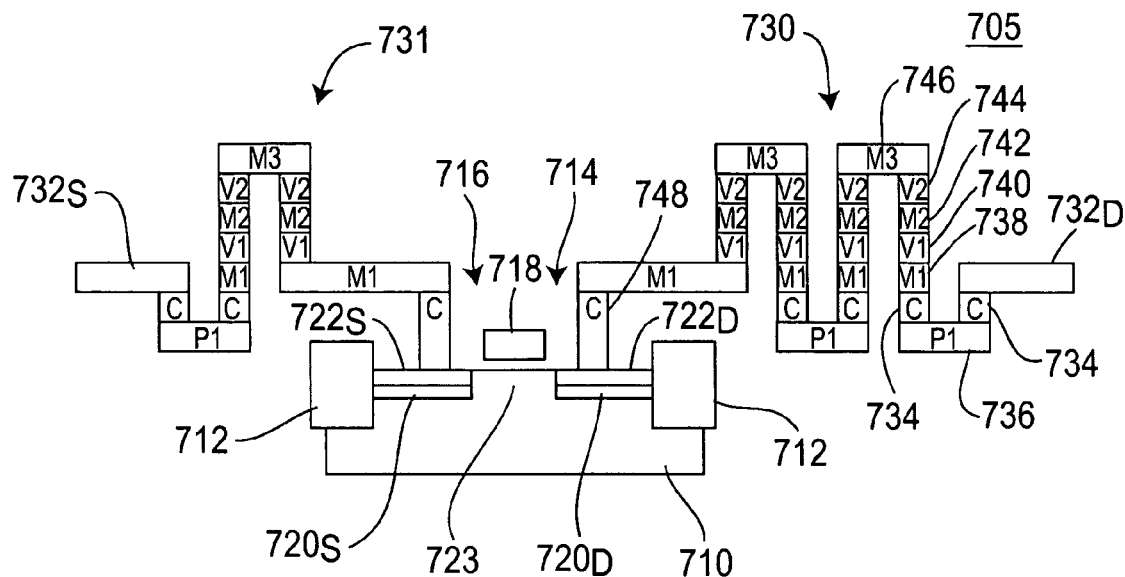
FIG. 7 depicts a cross-sectional view of a back-end ballasted, NMOS-trigger device.

FIG. 7 depicts a cross-sectional view of an external back-end ballasted, NMOS (BEBNMOS) trigger device 705. A plurality of ballasting resistors 730 and 731 (only one of each shown in FIG. 7), extends from the drain 714 and source 716 of the trigger device 705, and is used to separate electrically isolated ballasted current paths between the external contact and the contact electrodes of the ESD device, or the current carrying device being protected. These isolated ballasted current paths advantageously include in part, distributing current more evenly than other prior art devices, reducing current crowding, which in turn, reduces the localized heating of the ESD device, ballast resistance linearity, lower permissible values of ballast resistance, no added junction capacitance, more compact layout, no extra process steps as with silicide blocked devices, and the like.

Referring to FIG. 7, the source 716, drain 714, and gate 718 regions of the BEBNMOS trigger device 705 are formed by conventional fabrication processes known in the art. Specifically, the BEBNMOS trigger device 705 comprises a P-well 710 having a STI region disposed over the surface of the P-well 710. The gate 718 is disposed over a P-channel 723 and may illustratively be formed by a polysilicon layer disposed over a silicon dioxide layer, as discussed above with regard to FIG. 1B. The silicon and polysilicon are highly N doped semiconductor regions to form the N+ source region $720_S$ under the source electrode 716 and the N+ source region $720_D$ under the drain electrode 714, such that a P-channel 723 is formed between the source 716 and drain 714.

A single vertically meandering strip 730 illustratively connects to a common terminal $732_D$ to the drain region of the device 705. Following the path of the strip 730 and starting at the external common terminal $732_D$, the strip 730 includes a metal contact $734_1$, down to a segment of polysilicon 736, up to a second metal contact $734_2$, to a first metal layer 738, to a first via 740, to a segment of a second metal layer 742, to a second via 744, and to a segment of a third metal layer 746. The segment of the third metal layer 746 is connected to a second segment of the polysilicon layer 736 through a series connection of a via, a segment of the second metal layer 742, another via, a segment of the first metal layer 738, and another metal contact. This second segment of polysilicon is connected to a second segment of the third metal layer 746 through a metal contact, a segment of the first metal layer 738, a via, a segment of the second metal layer 742, and another via. Finally, in this exemplary embodiment, the second segment of the third metal layer 746 is connected to the drain region 714 of the ESD device 705 through a series connection of a via, a segment of the second metal layer 742, another via, a segment of a the first metal layer 738, and a connecting metal contact 748.

In the exemplary embodiment of the BEBNMOS triggering device 705, the first, second, and third metal layers 738, 742, and 746 may be fabricated from aluminum or copper films and the vias and connecting metal contact may be tungsten plugs or copper. These series connections form the ballasting resistor 730. In this embodiment, each of the vias and the metal contact adds a significant resistance (e.g., 5 to 10 ohms in advanced deep sub-micron technologies) and each of the segments of the polysilicon layers 736 add a significant resistance (e.g., 40 to 80 ohms in advanced deep sub-micron technologies) to the ballasting resistor 730. Each of the other layers also adds resistance to the ballasting resistor 730. However, the resistance of the metal layers 738, 742, and 746 is negligible as compared to the combined resistance of the polysilicon layers 736, the connecting metal contacts 734, and the vias 740.

Furthermore, a similar ballasting resistor 731 is formed over the source 716 of the BEBNMOS triggering device 705. However, the resistance is typically less than the resistance at the drain 714. In particular, less metal layer segments 738, 742, and 746, vias 740, polysilicon layer segments 736 and metal contacts 734 are utilized. Moreover, one skilled in the art will recognize that a satisfactory ballasting resistor may be fabricated using more or fewer layers and/or more or fewer meanders.

Figure 8:
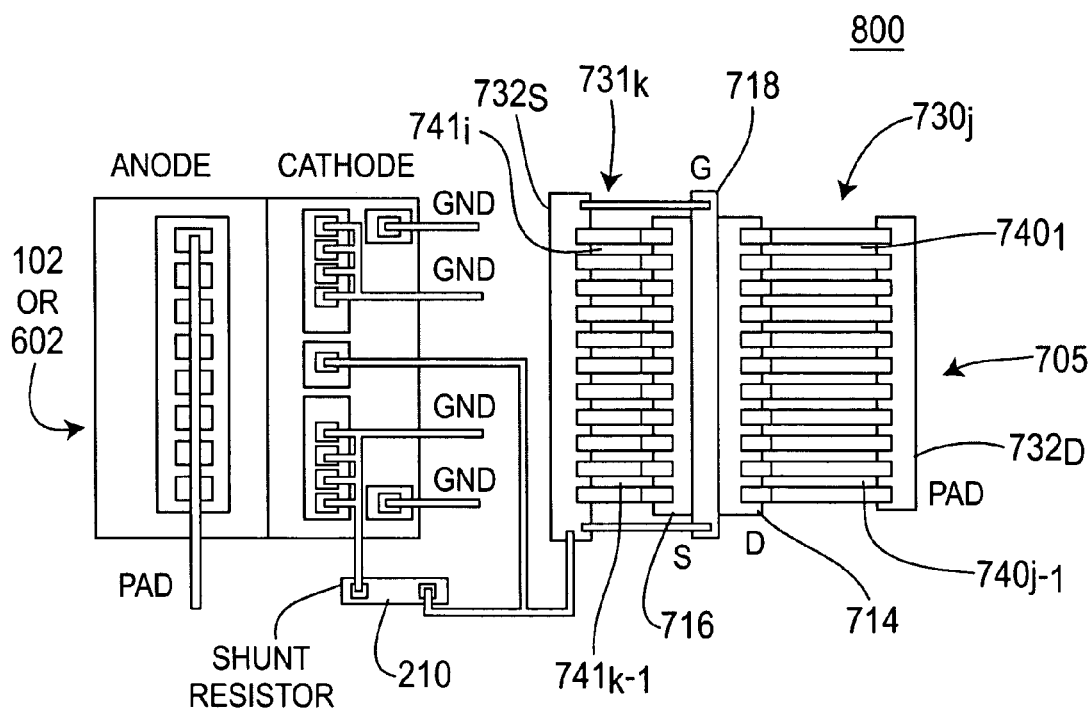
FIG. 8 depicts a top view of a SCR ESD protection device having a back-end ballasted, NMOS-trigger device.
Figure 9A:
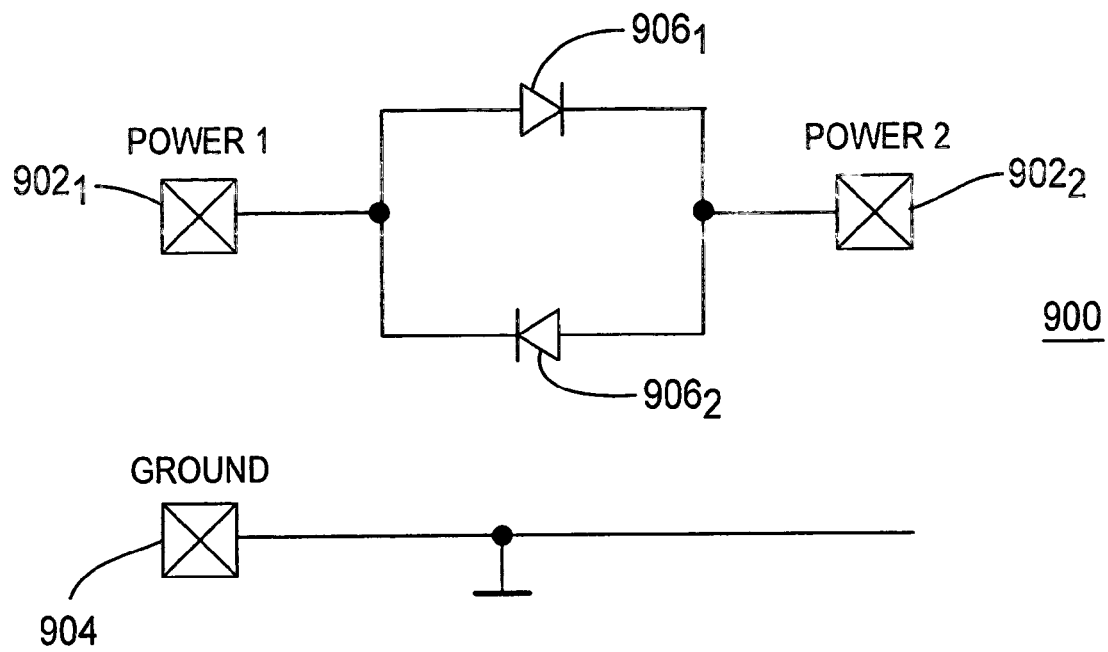
FIGS. 9A and 9B depict two prior art circuits illustratively providing power line to power line coupling.
Figure 9B:
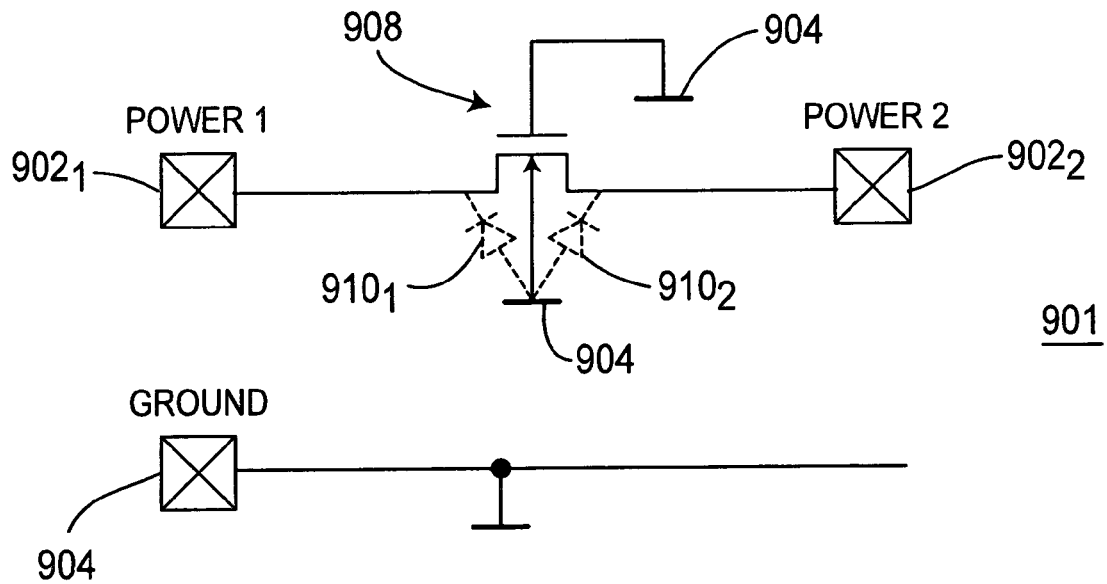

FIG. 8 depicts a top view of a ballasted, NMOS (BEBNMOS) triggered SCR ESD protection device 800. The BEBNMOS triggered SCR ESD protection device 800 comprises the SCR 202 of FIG. 3 or the SCR 602 of FIG. 6 coupled to the BEBNMOS trigger 705 of FIG. 7 and the external shunt resistor 210. In particular, the BEBNMOS trigger 705 has a plurality of the ballasting resistors $730_j$ coupled from the drain 714 to the external connector $732_D$. The external connector $732_D$ is then coupled to the pad 148. Similarly, the BEBNMOS trigger 705 has a plurality of the ballasting resistors $731_K$ coupled from the source 716 to the external connector $732_S$. The external connector $732_S$ is then coupled to one end of the shunt resistor 210. Each ballasting resistor 730 and 731 is illustratively fabricated with the meandering, non-intersecting strips in the manner described above in FIG. 7, and are separated from each other by spacings $740_1$ through $740_{K-1}$ on the drain region 714, and by spacings $741_1$ through $741_{K-1}$ on the source region 716.

The remaining circuitry of the BEBNMOS triggered SCR ESD protection device 800 is the same as described with regard to the embodiment in FIG. 6. As such, BEBNMOS trigger 705 and SCR 602 of the ESD protection device 800 have the STI 316 disposed over the entire surface area of the SCR, except for the high-doped anode 122, cathode 124, substrate ties 125, and trigger tap 401 regions 308, 312, 314, and 402, respectively, that are fully silicided.

The embodiments depicted in FIGS. 2-8 illustratively show that by using the carefully chosen trigger taps in conjunction with an external triggering device 205 (e.g., NMOS trigger), the base widths of the transistors T1 231 and T2 232 in the SCR 202 can be reduced. As such, the triggering speed of the SCR 202 is faster and triggering more reliable, as compared to the prior art ESD protection devices, while the current gain is increased. Fast triggering is a key to prevent trigger voltage overshoots as they occur in slow SCRs. Therefore, the fast SCRs of the present invention can successfully limit the transient voltage during an ESD to such a level that the ultra-thin gate oxides (less than 7 nm) of deep sub-micron processes are protected while prior art devices clearly show deficiencies.

FIGS. 10-14 depict schematic diagrams of various embodiments of anti-parallel configured SCR devices suitable for providing ESD protection between power lines of an IC. Specifically, the various embodiments provide ESD protection without interfering with a power down mode of operation, where one of the power lines is powered down to ground.

Figure 10:
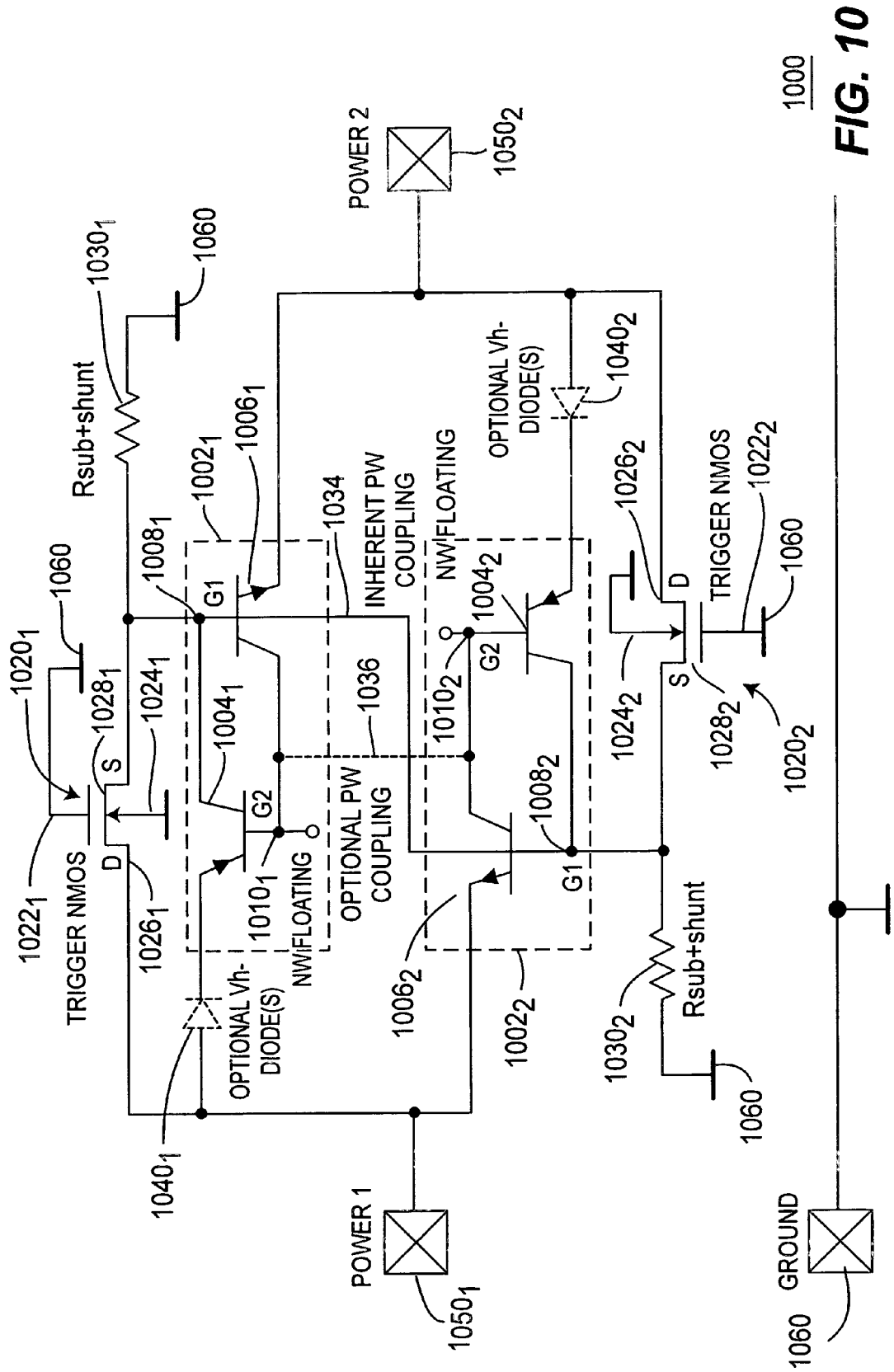
FIG. 10 depicts a schematic diagram of a first embodiment of an SCR ESD protection device of the present invention having two NMOS trigger devices.

FIG. 10 depicts a schematic diagram of a first embodiment of an SCR ESD protection device 1000 of the present invention having two NMOS trigger devices $1020_1$ and $1020_2$ (collectively NMOS trigger devices 1020). In particular, the ESD protection device 1000 comprises a first SCR $1002_1$ having a trigger NMOS device $1020_1$, and a second SCR $1002_2$ having an NMOS trigger device $1020_2$, where both SCR's $1002_1$ and $1002_2$ (collectively SCRs 1002) are coupled between a first power line $1050_1$ and a second power line $1050_2$. The first SCR device $1002_1$ is represented by a PNP transistor $1004_1$ and an NPN transistor $1006_1$. Similarly, the second SCR device $1002_2$ is represented by a PNP transistor $1004_2$ and an NPN transistor $1006_2$, and both SCRs 1002 are configured in a conventional manner as discussed above with the respect to FIGS. 2A and 2B.

In particular, the emitter of the NPN transistor $1006_1$ forms the cathode of the SCR $1002_1$, the collector of the NPN transistor $1006_1$ is coupled to the base of the PNP transistor $1004_1$, the emitter of the PNP transistor $1004_1$ forms the anode of the SCR $1002_1$, and the collector of the PNP transistor $1004_1$ is coupled to the base of the NPN transistor $1006_1$. In the exemplary embodiment of FIG. 10, the anode (i.e., emitter of the PNP transistor $1004_1$) is coupled to a pad of the first supply line $1050_1$, while the cathode (i.e., emitter of the NPN transistor $1006_1$) is coupled to a pad of the second supply line $1050_2$.

An external NMOS trigger device 1020 triggers each SCR 1002. In particular, a first NMOS trigger device $1020_1$ has a source $1028_1$ coupled to the first gate G1 $1008_1$ of the first SCR $1002_1$, and a drain $1026_1$ coupled to the emitter of the PNP transistor $1004_1$, as well as the first power line $1050_1$.

The bulk (P-substrate) $1024_1$ and gate $1022_1$ of the first NMOS trigger device $1020_1$ are both coupled to ground 1060. Furthermore, resistor $R_{sub+shunt}$ $1030_1$, which represents the intrinsic resistance of the substrate $R_{sub}$ plus a parallel-connected external on-chip shunt resistor ($R_{shunt}$), is coupled between the first gate G1 $1008_1$ of the first SCR $1002_1$ and ground 1060. Recall that the optional external shunt resistor $R_{shunt}$ has a resistance lower than the intrinsic substrate resistors $R_{sub}$, and is provided to shunt any leakage current to ground which otherwise might unintentionally trigger the SCR 1002.

Optionally, one or more holding voltage diodes $1040_1$ may be coupled in a forward conduction direction from the first power line $1050_1$ to the emitter of the PNP transistor $1004_1$. The holding voltage diode (only one shown in phantom) $1040_1$ is utilized to maintain the ESD protection device in a conductive "on" state within a tolerable voltage range. This voltage range is such that the remaining voltage between the first and second power lines $1050_1$ and $1050_2$ is safely above the operating voltage, thereby ensuring latch-up immunity.

The second SCR $1002_2$ and the corresponding external NMOS trigger device $1020_2$ are coupled between the first and second power lines $1050_1$ and $1050_2$, in a similar manner as discussed above with regard to the first SCR $1002_1$ and NMOS trigger device $1020_1$. In particular, the emitter of the NPN transistor $1006_2$, forms the cathode of the SCR $1002_2$, the collector of the NPN transistor $1006_2$ is coupled to the base of the PNP transistor $1004_2$, the emitter of the PNP transistor $1004_2$ forms the anode of the SCR $1002_2$, and the collector of the PNP transistor $1004_2$ is coupled to the base of the NPN transistor $1006_2$. In the exemplary embodiment of FIG. 10, the anode (i.e., emitter of the PNP transistor $1004_2$) is coupled to the pad of the second supply line $1050_2$, while the cathode (i.e., emitter of the NPN transistor $1006_2$) is coupled to the pad of the first supply line $1050_1$.

The NMOS trigger device $1020_2$ has a source $1028_2$ coupled to a first gate G1 $1008_2$ of the second SCR $1002_2$, and the drain $1026_2$ coupled to the emitter of the PNP transistor $1004_2$ and the second power line $1050_2$. The bulk (P substrate) $1024_2$ and gate $1022_2$ of the second NMOS trigger device $1020_2$ are both coupled to ground 1060.

Furthermore, resistor $R_{sub+shunt}$ $1030_2$, which represents the intrinsic resistance of the substrate $R_{sub}$ plus the parallel connected external on-chip shunt resistor $R_{shunt}$, is coupled to the first gate G1 $1008_2$ of the second SCR $1002_2$ and ground 1060, in a similar manner as discussed above regarding the first SCR $1002_1$ configuration.

As discussed above, one or more holding voltage diodes $1040_2$ may be coupled in a forward conduction direction from the second power line $1050_2$ to the emitter of the PNP transistor $1004_2$. The optional holding diode (only one diode shown in phantom) $1040_2$ is similarly utilized to maintain the second SCR $1002_2$ in a conductive "on" state. Accordingly, both SCRs $1002_1$ and $1002_2$ are connected between the power lines $1050_1$ and $1050_2$ in an anti-parallel manner.

The NMOS trigger devices 1020 and the SCRs 1002 provide the power-down-mode-compatible operation of the power lines 1050. For example, if the second power line $1050_2$ is powered down to ground 1060, then the reverse biased diode formed by the N+ drain region and P-substrate of the first NMOS trigger device $1020_1$ prevents the current from the first power line $1050_1$ from shunting to ground 1060. Similarly, if the first power line $1050_1$ is powered down to ground 1060, then the reverse biased diode formed by the N+ drain region and P-substrate of the second NMOS trigger device $1020_2$ prevents the current from the second power line $1050_2$ from shunting to ground 1060. Therefore, the ESD protection circuit 1000 is compliant with a power down mode of operation.

During normal operation of the IC, the SCRs $1002_1$ and $1002_2$ do not conduct any significant current besides the regular leakage currents, since at least one of the PN-junctions is reversed biased (and gate G1 of each of the SCRs 1002 is grounded). During an ESD event, the NMOS trigger devices $1020_1$ and $1020_2$ operate in a similar manner as the trigger devices of the GGSCR devices discussed with respect to FIG. 4. Furthermore, since the NMOS devices 1020 of the present embodiment do not have their respective gates connected to the source (rather, the gates are always connected to ground), the NMOS trigger devices 1020 will not conduct during normal mode of operation (i.e., regardless of any priority direction between the power lines, as is the case in the power-down mode with one of the power supplies connected to ground). Rather, the drain-substrate breakdown voltage of the NMOS device 1020 determines the trigger voltage.

For example, if an ESD event occurs at the pad of the first power line $1050_1$ and the second power line $1050_2$ is connected to ground, once the reverse bias trigger voltage Vt1 of the drain-substrate diode of the first trigger NMOS $1020_1$ is exceeded, the reverse biased diode conducts and turns on the parasitic bipolar transistor of the first trigger NMOS device $1020_1$, and current will flow into the trigger gate G1 $1008_1$ of the first SCR $1002_1$. This leads to an increase of the (local) potential of the base of the NPN $1006_1$. Once the potential rises above approximately 0.7 volts, the base-emitter junction of the NPN transistor $1006_1$ is forward biased and conducts, which also turns on the PNP transistor $1004_1$, thereby shunting the ESD current to the grounded second power line $1050_2$. Note further that the substrate 1024 and the ground power line 1060 are not grounded during the ESD event, but are merely floating.

The SCRs 1002 may be manufactured by any standard CMOS technology with an N-Well and P-well illustratively disposed over a P-substrate. The P-well of the ESD protection device 1000 is shared by both SCRs $1002_1$ and $1002_2$, and therefore line 1034 of FIG. 10 represents the inherent coupling therebetween.

It is further noted that the first embodiment of the ESD protection device 1000 of the present invention does not necessitate the implementation of a deep N-well and/or isolated P-well therein. An isolated P-well may be available in some processes normally to improve the isolation from a "noisy" substrate, as it is often needed for RF and analog circuits. Additionally, an isolated P-well is often used to improve the ESD performance of certain ESD protection devices. It is noted that such isolated P-well is not required for the present embodiment of the invention. However, an ESD protection device of the present invention having a deep N-Well and/or isolated P-well will not interfere with the power down mode of operation of the present invention. Moreover, it is also possible to have the SCRs 1002 each in an isolated P-well since the resistor $R_{sub+shunt}$ 1030 provides a resistive grounding of that isolated P-well. That is, the SCRs 1002 may be manufactured in any standard CMOS technology having an N-well and P-well illustratively formed in a P-substrate. Thus, there is no need for a deep N-well/isolated P-well process option, however use of such process options would not interfere with the function of the present invention.

The N-wells of the two anti-parallel SCRs $1002_1$ and $1002_2$ may be left floating, or may be connected (e.g., via N+ regions respectively disposed in the N-wells) to the corresponding anode of each SCR for illustratively controlling the triggering and holding currents. For a detailed understanding of a high holding current SCR, the reader is directed to U.S. patent application Ser. No. 10/099,263, filed Mar. 15, 2002, which is incorporated by reference herein in its entirety. Furthermore, the N-wells of each SCR may be connected together. Specifically, an external on-chip connection may be provided via N+ doped regions disposed in each of the N-wells. That is, each of the first and second SCRs 1002 may comprise a second trigger gate formed by an N+ region disposed in the N-wells, where the N+ regions are coupled together via external on-chip wiring.

Alternatively, the N-wells may be formed as a single joint) N-well, which is illustratively represented by line 1036 (drawn in phantom). That is, the floating N-wells may be internally coupled or formed as a single N-well (e.g., having a polygon shape) that is shared between the two anti-parallel SCRs 1002. It is noted that a joint N-well does not require the N+ doped regions disposed therein, since there is no external on-chip coupling of the N-wells between the SCRs 1002. It is noted that the coupling or joining the N-wells of the two SCRs 1002 helps reduce the amount of real estate required to fabricate the ESD device of the present invention. It is further noted that in this latter instance, the N-well must be left floating to avoid a short between the two power lines $1050_1$ and $1050_2$.

Figure 11:
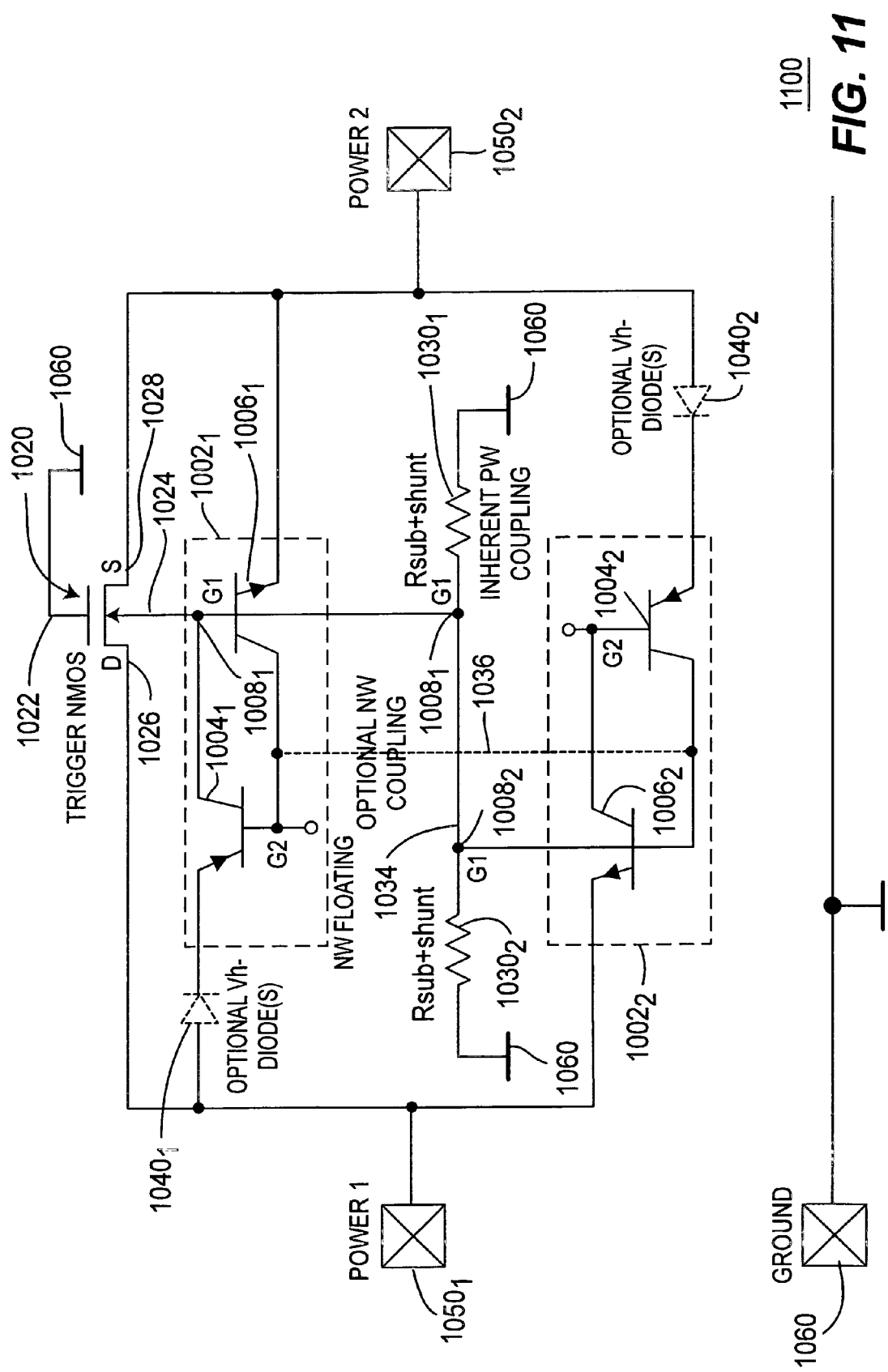
FIG. 11 depicts a schematic diagram of a second embodiment of an SCR ESD protection device of the present invention having one NMOS trigger device.

FIG. 11 depicts a schematic diagram of a second embodiment of an SCR ESD protection device 1100 of the present invention having an NMOS trigger device 1020. The second embodiment is similar to the first embodiment described above with respect to FIG. 10, except that only one trigger NMOS 1020 is utilized to provide a more compact layout for the ESD protection device 1100. Specifically, the emitter of the NPN transistor $1006_1$ of the first SCR 1002 is connected to the pad of the second supply line $1050_2$, while the emitter of the PNP transistor $1004_1$ is coupled to the pad of the first power line $1050_1$. Similarly, the emitter of the NPN transistor $1006_2$ of the second SCR $1002_2$ is connected to the pad of the first supply line $1050_1$, while the emitter of the PNP transistor $1004_2$ is coupled to the pad of the second power line $1050_2$.

The single NMOS trigger device 1020 is coupled to both SCRs $1002_1$ and $1002_2$. However, for purposes of illustrating this second embodiment, the schematic drawing of FIG. 11 illustratively depicts the NMOS trigger device 1020 placed closer to the first SCR $1002_1$.

In particular, the single NMOS trigger device 1020 has its source 1028 coupled to a pad of the second power line $1050_2$, while the drain 1026 of the NMOS transistor 1020 is coupled to the pad of the first power line $1050_1$. The gate 1022 of the NMOS trigger device 1020 is coupled to ground 1060. The P-well of the NMOS trigger device 1020 is coupled to the P-substrate/P-well 1024 of the first and second SCRs $1002_1$ and $1002_2$, as well as the first gates G1 $1008_1$ and $1008_2$ of the first and second SCRs $1002_1$ and $1002_2$. It is noted that both SCRs $1002_1$ and $1002_2$ share the P-well, as illustratively shown by line 1034 in FIG. 11.

In this second embodiment, the resistance $R_{sub+shunt}$ $1030_1$, representing the intrinsic substrate resistance ($R_{sub}$) and the parallel-connected external shunt resistor ($R_{shunt}$) are coupled to the bulk terminal $1008_1$ (P-substrate/P-well) of the NPN transistor $1006_1$ of the first SCR $1002_1$ and ground 1060. Similarly, the resistance $R_{sub+shunt}$ $1030_2$ is coupled to the bulk terminals $1008_2$ (P-substrate/P-well) of the NPN transistors 1006 of the first/second SCR $1002_1$/$1002_2$ and ground 1060. During normal operation of the IC, the SCRs $1002_1$ and $1002_2$ are turned off. The purpose of the resistors $R_{sub+shunt}$ 1030 is to prevent unwanted triggering by draining away any leakage current.

Furthermore, the ESD protection circuit is power-down-mode-compliant, since the single NMOS trigger device 1020 acts as a reversed biased diode with respect to each power line 1050. For example, if the second power line $1050_2$ powers down to ground 1060, the drain-to-substrate diode of the NMOS device $1020_1$ prevents the current from the first power line $1050_1$ from shunting to ground 1060.

As mentioned above, the P-well is shared between the NPN transistors 1006 of the SCRs 1002. Accordingly, coupling and injection of the trigger current from the trigger NMOS device 1020 is provided through the P substrate/P-well.

In particular, during an ESD event (positive polarity ESD event) illustratively occurring at the pad of the second power line $1050_2$, while the first power line $1050_1$ is grounded, the source-to-substrate diode of the NMOS trigger device 1020 becomes reversed biased, enters avalanche breakdown, and injects current into the substrate while the potential of the latter starts to rise. Once the voltage across the base-emitter of the NPN $1006_2$ of the second SCR $1002_2$ rises above 0.7 volts, the second SCR $1002_2$ turns on and shunts the ESD current to the grounded first power line $1050_1$ in a conventional manner.

It is noted that the trigger current injection occurs in both SCRs, but only one SCR will trigger because the SCR can only conduct in one direction. That is why two anti-parallel SCRS are provided between the power lines 1050. In particular, for the opposite ESD stress polarity (first power line $1050_1$ receives the ESD pulse, while second power line $1050_2$ grounded), the quasi-symmetrical circuit will provide the ESD conduction in a similar manner. That is, the first SCR $1002_1$ will turn on, while the second SCR $1002_2$ remains inactive.

As discussed above with respect to FIG. 10, the N-wells of the two anti-parallel SCRs 1002 may be left floating or may be connected to a corresponding anode for each SCR to control the trigger and holding currents, or the N-wells (if left floating) may be connected together via N+ doped regions disposed therein (or formed as a joint N-well), as illustratively shown by line 1036 (drawn in phantom) to reduce the layout of the protection circuit. That is, the second embodiment shown in FIG. 11 is more compact than the first embodiment of FIG. 10, since only one trigger NMOS device 1020 is utilized. Moreover, the optional holding voltage diodes 1040 may be coupled in a forward conduction direction from the power lines 1050 to the emitter of the PNP transistor of each SCR 1002.

For example, a holding voltage diode $1040_1$ is coupled in a forward conductive direction from the pad of the first power line $1050_1$ to the emitter of the PNP transistor $1004_1$ of the first SCR $1002_1$, while an optional holding voltage diode $1040_2$ may similarly be coupled in a forward conduction direction from the pad of the second line $1050_2$ to the emitter of the PNP transistor $1004_2$ of the second SCR $1002_2$. The optional holding voltage diodes are utilized to increase the holding voltage of the SCRs above the supply voltage. It is noted that although only a single holding diode 1040 is illustratively shown being coupled to each SCR 1002, one skilled in the art will appreciate that a chain of serially coupled holding diodes may be implemented for each SCR 1002.

Figure 12:
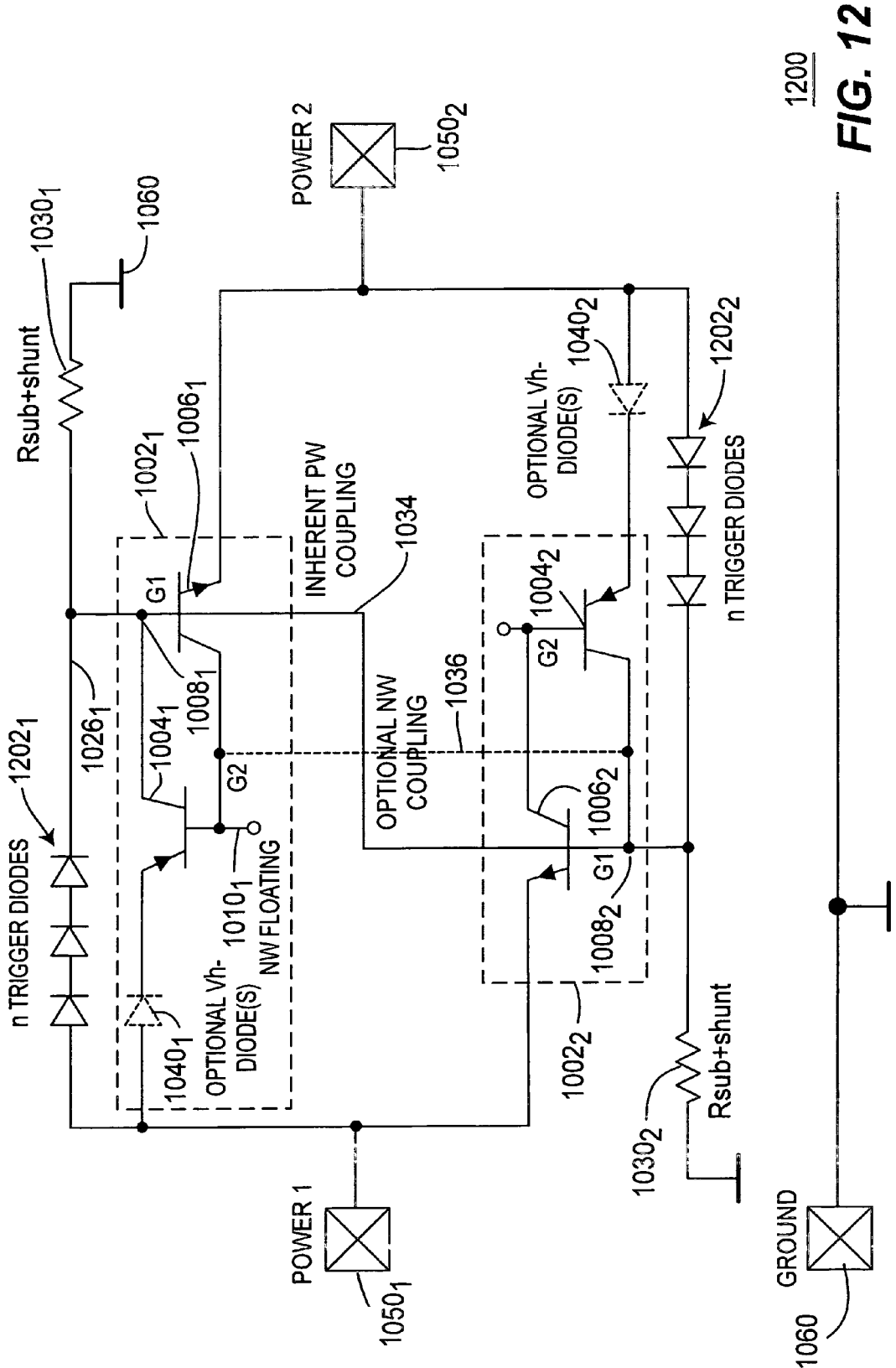
FIG. 12 depicts a schematic diagram of a third embodiment of an SCR ESD protection device of the present invention having diode trigger devices.

FIG. 12 depicts a schematic diagram of a third embodiment of an SCR ESD protection device 1200 of the present invention having a diode trigger device 1202. FIG. 12 is the same as FIG. 10 except that each NMOS trigger device 1020 is replaced by one or more serially coupled trigger diodes 1202.

For example, three exemplary diodes are serially coupled in a forward conduction direction from the emitter (anode) of the PNP transistor $1004_1$ to the first gate G1 $1008_1$ of the first SCR $1002_1$. Similarly, three exemplary diodes are illustratively serially coupled in a forward conduction direction from the emitter (anode) of the PNP transistor $1004_2$ to the first gate G1 $1008_2$ of the second SCR $1002_2$. Thus, both SCR's 1002 are triggered by the serially coupled diodes 1202.

Further, with respect to the third embodiment of FIG. 12, the N-wells of the two anti-parallel SCRs 1002 may be left floating or may be connected to a corresponding anode for each SCR to control the trigger and holding currents, or the N-wells may be connected together (or a joint N-well) as illustratively shown by line 1036 (drawn in phantom) to reduce the layout of the protection circuit, as discussed above with respect to FIGS. 10 and 11.

During normal operation of the IC, the trigger diodes 1202 do not conduct, and accordingly the SCRs 1002 are turned off. Furthermore, each illustrative chain of trigger diodes 1202 of the ESD protection device 1200 also allows the IC to operate in a power down mode of operation. That is, this third embodiment is power down compliant.

For example, if the first power line $1050_1$ powers down to ground 1060, while and the second power line $1050_2$ is biased to the nominal supply voltage, the trigger diodes $1202_2$ as well as the base-emitter diode of NPN transistor $1006_2$ of the second SCR $1002_2$ will see a slight forward bias but will only insignificantly conduct current. In fact, the number of trigger diodes 1202 is determined such that there is only a small and acceptable amount of current flowing during normal operating conditions. The DC voltage across the diodes is dependent upon the number of triggering diodes included in the triggering diode chain. For a detailed understanding of implementing a chain of triggering diodes to trigger and SCR, the reader is directed to patent application Ser. No. 10/099,600, filed Mar. 15, 2002, which is incorporated by reference herein in its entirety. Moreover, this embodiment of the invention is mostly used for low to very low supply voltages where only a relatively small number of trigger diodes is required but also a low or very low turn-on voltage is desired for optimal gate oxide ESD protection.

Moreover, during an ESD event, when the voltage illustratively rises above approximately 2.8 volts (e.g., 0.7 volts per trigger diode including the base-emitter diode of the NPN in the SCR 1002), the exemplary diodes are forward biased and inject current into the first gate G1 $1008_1$ of the SCR 1002. For example, if a positive ESD event occurs at the pad of the first power line $1050_1$, while the second power line $1050_2$ is grounded and the substrate is floating, the voltage across the power lines $1050_1$ and $1050_2$ will rise over a trigger voltage threshold of 2.8 volts. Once the base-emitter diode of the NPN transistor $1006_1$ turns on (is forward biased), the first SCR $1002_1$ will also turn on and shunt the ESD current to the grounded second power line $1050_2$. A similar analysis may be performed for an ESD event occurring on a pad of the second power line $1050_2$ while the first power $1050_1$ line grounded. It is noted that a similar arrangement may be provided to initiate triggering of the SCRs via the second gate G2 1010, as discussed below with respect to FIG. 13.

Figure 13:
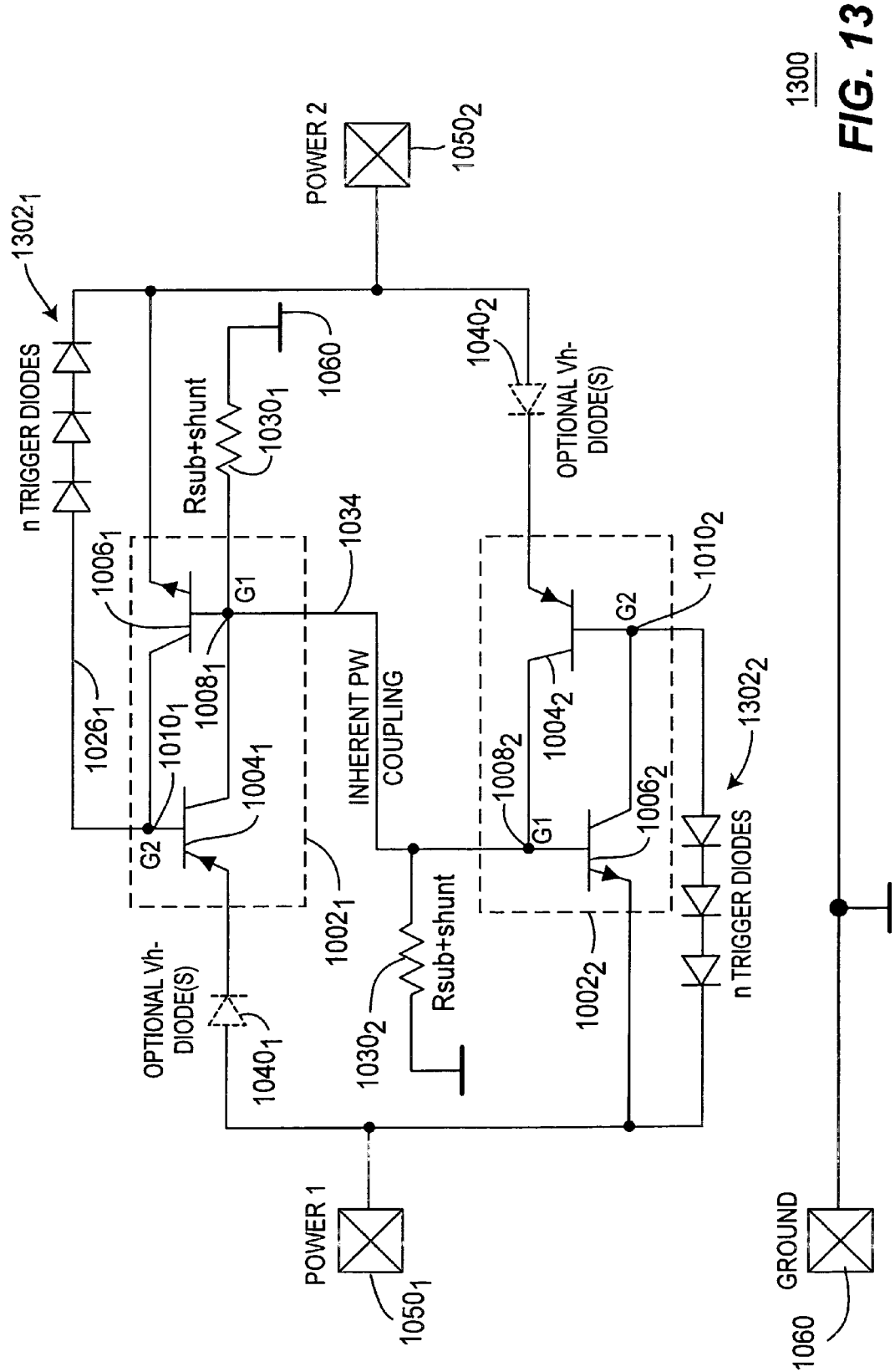
FIG. 13 depicts a schematic diagram of a fourth embodiment of an SCR ESD protection device of the present invention having diode trigger devices.

FIG. 13 depicts a schematic diagram of a fourth embodiment of an SCR ESD protection device 1300 of the present invention having a diode trigger device 1302. In particular, the first and second SCRs $1002_1$ and $1002_2$ are coupled between the first and second power lines $1050_1$ and $1050_2$ as discussed above with respect to FIGS. 10-12.

At least one trigger diode 1302 is coupled in the forward conduction direction from the second gate G2 1010 of each SCR 1002 to the emitter of the NPN transistor 1006 and its respective power line 1050. For example, a first trigger diode $1302_1$ illustratively comprises three serially coupled diodes that are coupled in the forward conduction direction from the second gate $1010_1$ of the first SCR $1002_1$ to the emitter (cathode) of the NPN transistor $1006_1$ and a pad of the second power line $1050_2$. Similarly, the second trigger diode $1302_2$ illustratively comprises three serially coupled diodes that are coupled in the forward conduction direction from the second gate $1010_2$ of the second SCR $1002_2$ to the emitter (cathode) of the NPN transistor $1006_2$ and a pad of the first power line $1050_1$.

In this fourth embodiment, the resistance $R_{sub+shunt}$ $1030_1$, representing the intrinsic substrate resistance ($R_{sub}$) and the parallel-connected external shunt resistor ($R_{shunt}$), is coupled to the bulk terminal (P-substrate/P-well) of the NPN transistor $1006_1$ of the first SCR $1002_1$ and ground 1060. Similarly, the resistance $R_{sub+shunt}$ $1030_2$ is coupled to the bulk terminal (P-substrate/P-well) of the NPN transistor $1006_2$ of the second SCR $1002_2$ and ground 1060.

During normal operation of the IC, when at least one the power supply lines 1050 is powered up, the trigger diode devices 1302 do not conduct, and accordingly the SCRs 1002 are turned off. Furthermore, each illustrative chain of trigger diodes 1302 of the ESD protection device 1300 also allows the IC to operate in a power down mode of operation. That is, this fourth embodiment is power down compliant. For example, if the first power line $1050_1$ powers down to ground 1060 and the second power line $1050_2$ is biased to the nominal supply voltage, the trigger diodes $1302_2$ as well as the base-emitter diode of PNP transistor $1004_2$ of the second SCR $1002_2$ will see a slight forward bias, however the current conducted is deemed insignificant. The number of trigger diodes 1302 implemented in the trigger diode chain is dependent on the desired triggering voltage and the operation voltages of the power lines 1050, and the applications of this fourth embodiment of the invention are very similar to the second embodiment shown in FIG. 12, as described above.

Moreover, during an ESD event, when the voltage illustratively goes above 2.8 volts (0.7 volts per trigger diode including the base-emitter diode of the NPN 1006 in the SCR 1002), the exemplary diodes are forward biased and draw current from the second gate G2 1010 of the SCR 1002. For example, if an ESD event occurs at the pad of the first power line $1050_1$, while the second power line $1050_2$ is grounded and the substrate is floating, the voltage between the power lines $1050_1$ and $1050_2$ will rise over a trigger voltage threshold of approximately 2.8 volts, and the SCR will turn on in a similar as described for the second embodiment of the invention as shown in FIG. 12. Also, a similar analysis may be performed for an ESD event occurring on a pad of the second power line $1050_2$ when the first power line $1050_1$ is connected to ground.

It is noted with respect to FIGS. 12 and 13, that for triggering at the second trigger gates G2 of the SCRs 1002, the number of required triggered diodes is typically one (1) less than for triggering via the first trigger gates G1 of the SCRs 1002, while the DC leakage current is approximately the same. That is, a lower trigger voltage is realized for the same DC leakage current. For a detailed understanding of diode triggering devices, the reader is directed to patent application Ser. No. 10/099,600, filed Mar. 15, 2002. Further, with respect to the fourth embodiment of FIG. 13, the N-well regions are not coupled (as discussed with respect to FIG. 12) in order to prevent a resistive short between the two power supply lines $1050_1$ and $1050_2$.

Moreover, in both FIGS. 12 and 13, the optional holding voltage diodes 1040 may be coupled in a forward conduction direction from the power lines 1050 to the emitter of the PNP transistor 1004 of each SCR 1002. For example, a holding voltage diode $1040_1$ is coupled in a forward conductive direction from the pad of the first power line $1050_1$ to the emitter of the PNP transistor $1004_1$ of the first SCR $1002_1$, while a optional holding voltage diode $1040_2$ may similarly be coupled in a forward conduction direction from the pad of the second line $1050_2$ to the emitter of the PNP transistor $1004_2$ of the second SCR $1002_2$. The optional holding voltage diodes 1040 are utilized to increase the holding voltage of the SCRs 1002. It is noted that although only a single holding voltage diode 1040 is shown coupled to each SCR 1002, a chain of serially coupled holding voltage diodes may be implemented for each SCR.

Figure 14:
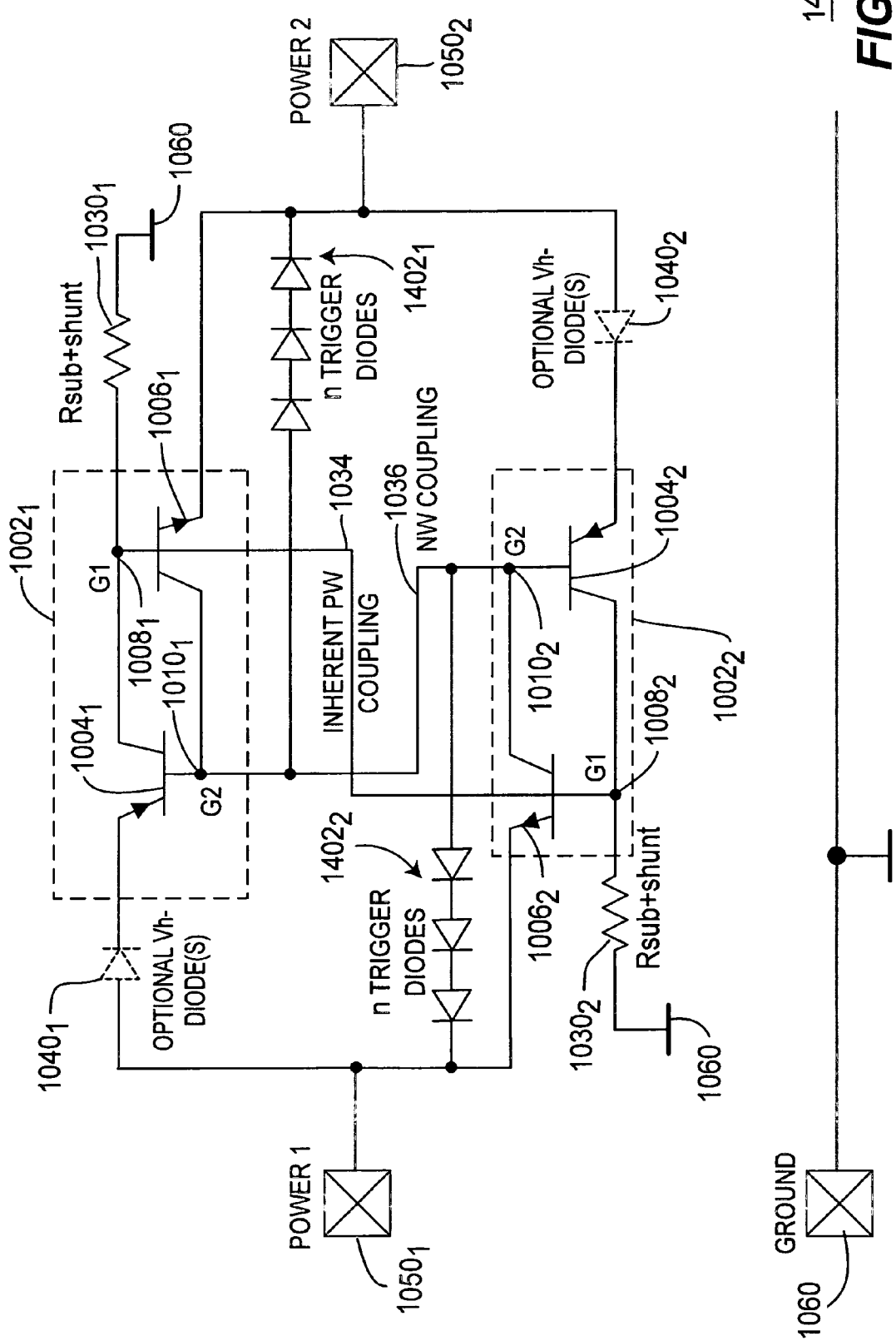
FIG. 14 depicts a schematic diagram of a fifth embodiment of an SCR ESD protection device of the present invention having two diode trigger devices.

FIG. 14 depicts a schematic diagram of a fifth embodiment of an SCR ESD protection device 1400 of the present invention having two diode trigger devices $1402_1$ and $1402_2$ (collectively diode trigger devices 1402). The first and second SCRs $1002_1$ and $1002_2$ are coupled between the first and second power lines $1050_1$ and $1050_2$ as discussed above with respect to FIGS. 10-13.

In particular, the emitter of the NPN transistor $1006_1$ forms the cathode of the SCR $1002_1$, the collector of the NPN transistor $1006_1$ is coupled to the base of the PNP transistor $1004_1$, the emitter of the PNP transistor $1004_1$ forms the anode of the SCR $1002_1$, and the collector of the PNP transistor $1004_1$ is coupled to the base of the NPN transistor $1006_1$. In the exemplary embodiment of FIG. 14, the anode (i.e., emitter of the PNP transistor $1004_1$) is coupled to a pad of the first supply line $1050_1$, while the cathode (i.e., emitter of the NPN transistor $1006_1$) is coupled to a pad of the second supply line $1050_2$.

Furthermore, the resistor $R_{sub+shunt}$ $1030_1$, which represents the intrinsic resistance of the substrate ($R_{sub}$) plus an optional parallel-connected external on-chip shunt resistor ($R_{shunt}$), is coupled between the first gate G1 $1008_1$ of the first SCR $1002_1$ and ground 1060. Similarly, the resistor $R_{sub+shunt}$ $1030_2$ is coupled between the first gate $1008_2$ of the NPN transistor $1006_2$ of the second SCR $1002_2$ and ground 1060.

In this fifth embodiment, the optional N-well connections to the respective SCR anodes are not provided. However, the N-well is shared between the two SCRs $1002_1$ and $1002_2$, as represented by line 1036. Accordingly, the trigger diode devices $1402_1$ and $1402_2$ are respectively coupled in a forward conductive direction from the shared N-well (trigger gates G2 1010 of the SCRs 1002) to each power line 1050. In particular, the first trigger diode device $1402_1$ is coupled from the N-well to the pad of the second power line $1050_2$, while the second trigger diode device $1402_2$ is coupled from the N-well to the pad of the first power line $1050_1$. As discussed above, the trigger diode devices 1402 may comprise a plurality of serially coupled diodes. In FIG. 14, three serially coupled diodes are utilized in each trigger diode device $1402_1$ and $1402_2$. It is further noted that the optional holding voltage diodes 1040 may be provided between each power line 1050 and emitter of each PNP transistor 1004, in a similar manner as discussed above with respect to FIGS. 10-13.

During normal operation of the IC, the trigger diode devices 1402 do not conduct any significant current, and accordingly the SCRs $1002_1$ and $1002_2$ are turned off. Furthermore, each illustrative chain of trigger diodes $1402_1$ and $1402_2$ of the ESD protection device 1400 also allows the IC to operate in a power down mode of operation. That is, this fifth embodiment is power down compliant and has the same advantages and operates in a similar manner as discussed above with respect to FIG. 13. It is noted that the fifth embodiment of FIG. 14 has a shared Nwell between the SCRs, while the third embodiment of FIG. 13 does not share the Nwells. An advantage of the shared Nwell region in FIG. 14 is a more compact layout style leading to some area savings.

Thus, the various exemplary embodiments shown in FIGS. 10-14 may be utilized to provide ESD protection for the power lines of an IC, and are fully compliant with the power down mode of operation. That is, where one supply line is powered down to ground, the ESD protection to the other power line does not interfere by illustratively shunting the other power line to ground as well.

The ESD protection devices of FIGS. 10-14 have high clamping efficiency as compared with the prior art NMOS solution because of the low holding voltage of the SCR. Furthermore, the layouts of these ESD protection devices are area efficient because of the high permissible power and current densities of the SCR devices, as compared to the prior art NMOS solutions.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection circuit in a semiconductor integrated circuit (IC) having protected circuitry, the ESD protection circuit comprising:

a silicon controlled rectifier (SCR) having at least one first type high dopant region formed in a second type low dopant region coupled to a first reference potential of the protected circuitry and at least one second type high dopant region coupled to a second reference potential of said IC;

at least one trigger tap disposed outside of a surface area between the first type high dopant region and the second type high dopant region, said trigger tap formed in said second type low dopant region; and a MOS transistor located outside of the surface area between the first type high dopant region and the second type high dopant region of the SCR, said transistor adapted for injecting a trigger current via said trigger tap into at least one gate of said SCR.

2. The ESD protection circuit of claim 1, wherein said at least one trigger-tap; disposed proximate to at least one of the first type high dopant regions and the second type high dopant regions.

3. The ESD protection circuit of claim 2, wherein said MOS transistor is coupled between said protected circuitry and said at least one trigger-tap.

4. The ESD protection circuit of claim 1, further comprising a resistor that is not part of the SCR's internal series resistance, coupled between at least one of the first type high dopant region and the second type high dopant region, and the MOS transistor.

5. An electrostatic discharge (ESD) protection circuit in a semiconductor integrated circuit (IC) having protected circuitry, the ESD protection circuit comprising:
a SCR further comprising:
a substrate;
a first type conductive well and an adjacent second type conductive well formed in said substrate and defining a junction therebetween;
at least one first type doped region formed in said second type conductive well and coupled to first voltage reference of said protected circuitry;
at least one second type doped region formed in said first type conductive well and coupled to a second voltage reference of said protected circuitry;
at least one trigger tap dispose outside of a surface area between the first type doped region and the second type doped region, said trigger tap formed in said second type conductive well; and
a MOS transistor coupled to the SCR and protected circuitry, and adapted to inject a trigger current via said trigger tap into said second type conductive well, wherein said MOS transistor and SCR are separate and distinct devices incorporated on the IC such that the MOS transistor is located outside the surface area between the first type doped region and the second type doped region of the SCR.

6. The ESD protection circuit of claim 5 wherein said at least one trigger tap disposed proximate to at least one of said first type doped region in said second type conductive well and said second type doped region in said first type conductive well.

7. The ESD protection circuit of claim 6, further comprising at least one shunt resistor coupled between said at least one trigger tap and at least one of said first type doped region and said second type doped region.

8. The ESD protection circuit of claim 5, wherein distance between edge of said second type doped region and said junction is 4.0 microns or less and distance between edge of said first type doped region and said junction is 4.0 microns or less.

9. The ESD protection circuit of claim 8 wherein said distance is in the range between about 0.6 microns and about 0.8 microns.

* * * * *